United States Patent
Kang et al.

(10) Patent No.: US 10,845,931 B2
(45) Date of Patent: Nov. 24, 2020

(54) TOUCH DISPLAY DEVICE, MICROCONTROLLER, AND DRIVING METHOD

(71) Applicant: LG Display Co., Ltd., Seoul (KR)

(72) Inventors: Seongkyu Kang, Gyeonggi-do (KR); SungChul Kim, Gyeonggi-do (KR); HoonBae Kim, Seoul (KR); SunYeop Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/438,929

(22) Filed: Jun. 12, 2019

(65) Prior Publication Data

US 2019/0384452 A1    Dec. 19, 2019

(30) Foreign Application Priority Data

Jun. 14, 2018    (KR) .................. 10-2018-0068114

(51) Int. Cl.
*G06F 3/044*   (2006.01)
*G06F 1/10*    (2006.01)
*H05K 1/02*    (2006.01)

(52) U.S. Cl.
CPC .............. *G06F 3/0443* (2019.05); *G06F 1/10* (2013.01); *H05K 1/0274* (2013.01)

(58) Field of Classification Search
CPC combination set(s) only.
See application file for complete search history.

(56) References Cited

U.S. PATENT DOCUMENTS

2016/0334934 A1*   11/2016   Mo .................. G06F 3/0416

\* cited by examiner

*Primary Examiner* — Deeprose Subedi
(74) *Attorney, Agent, or Firm* — Seed IP Law Group LLP

(57) ABSTRACT

A touch display device, a microcontroller, and a driving method. During touch driving, no phase difference is generated among a plurality of pulse signals generated by a display panel, a printed circuit board, etc. Unnecessary parasitic capacitance is prevented from occurring between a touch electrode, to which a touch-sensing driving signal is applied, and surrounding other electrodes. Touch sensing performance is improved, and display performance is improved.

18 Claims, 33 Drawing Sheets

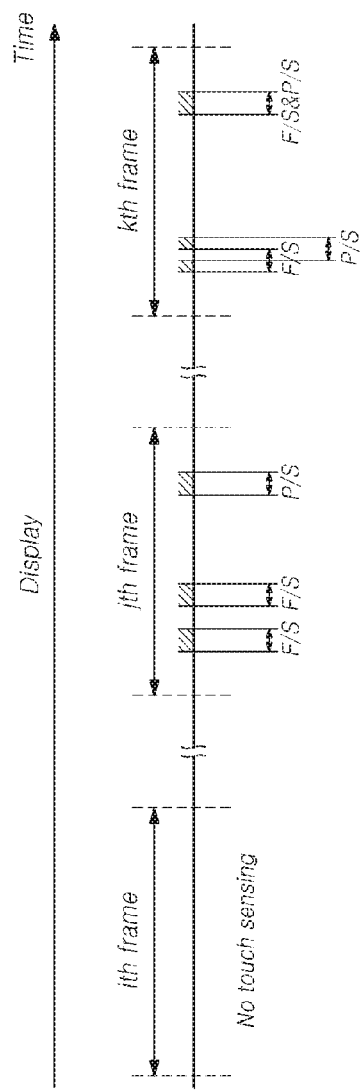

FIG.8
TDS
(Case 1) TDS1 
(Case 2) TDS2 
(Case 3) TDS3 

(Case 1)

(Case 2)

(Case 3)

TOUCH DISPLAY DEVICE, MICROCONTROLLER, AND DRIVING METHOD

CROSS REFERENCE TO RELATED APPLICATION

This application claims priority to Korean Patent Application No. 10-2018-0068114, filed Jun. 14, 2018, which is hereby incorporated by reference for all purposes as if fully set forth herein.

BACKGROUND

Technical Field

Exemplary embodiments relate to a touch display device, a microcontroller, and a driving method.

Description of Related Art

With the development of the information society, there has been an increasing demand for image display devices. In this regard, a range of display devices, such as liquid crystal display (LCD) devices, plasma display devices, and organic light-emitting diode (OLED) display devices, have recently come into widespread use.

Among such display devices, touch display devices provide touch-based user interfaces enabling users to intuitively and conveniently input data or instructions directly to devices, rather than using conventional data input systems, such as buttons, a keyboard, or a mouse.

Touch display devices of the related art can detect a touch by detecting capacitance generated on one or more touch electrodes by applying a driving signal to a plurality of touch electrodes disposed in a touch panel.

In some cases of touch display devices of the related art, a touch panel, with a plurality of touch electrodes being disposed therein, may be embedded in a display panel. In such a case in which the plurality of touch electrodes are embedded in the display panel, when a driving signal is applied to specific touch electrodes of the plurality of touch electrodes, unnecessary parasitic capacitance may be generated between the specific touch electrodes, to which the driving signal is applied, and other electrodes or lines surrounding the touch electrodes (i.e., the remaining touch electrodes, data lines, gate lines, etc.). Such unnecessary parasitic capacitance may degrade touch sensing performance, which is problematic.

BRIEF SUMMARY

Various aspects of the present disclosure provide a touch display device, a microcontroller, and a driving method, able to prevent unnecessary parasitic capacitance from being generated between touch electrodes, to which a driving signal is applied for touch sensing, and other surrounding electrodes.

Also provided are a touch display device, a microcontroller, and a driving method, able to prevent a phase difference between a touch electrode driving signal and a variety of other pulse signals in the case of panel driving for touch sensing.

Also provided are a touch display device, a microcontroller, and a driving method, able to simultaneously perform display processing and touch sensing, and in the case of driving for the display processing and the touch sensing, prevent phase differences among a variety of pulses generated by a display panel, a printed circuit board (PCB), etc.

Also provided are a touch display device, a microcontroller, and a driving method, able to generate a variety of pulse signals necessary for the driving, on the basis of reference pulse signals having a variety of phase differences, and using the variety of generated pulse signals in the driving, thereby preventing phase differences among the variety of pulse signals generated by a display panel, a printed circuit board, and the like during driving in which display processing and touch sensing are simultaneously performed.

According to an aspect of the present disclosure, a touch display device may include: a display panel in which a plurality of data lines, a plurality of gate lines, and a plurality of touch electrodes are disposed; a gate driver circuit electrically connected to the display panel, and sequentially outputting a gate signal to the plurality of gate lines; a data driver circuit electrically connected to the display panel, and outputting a data signal to the plurality of data lines; a touch driver circuit electrically connected to the display panel, and outputting a touch electrode driving signal to one or more touch electrodes among the plurality of touch electrodes; a printed circuit board electrically connected to the display panel; a touch power circuit mounted on the printed circuit board, and electrically connected to at least one of the gate driver circuit, the data driver circuit, or the touch driver circuit; and a microcontroller mounted on the printed circuit board, and outputting two or more reference pulse signals including a first reference pulse signal and one or more other reference pulse signals.

The touch electrode driving signal may be based on the first reference pulse signal.

While the touch electrode driving signal is being applied to the one or more touch electrodes, one or more pulse signals based on the other reference pulse signals may be applied to the display panel or the printed circuit board.

The first reference pulse signal and the other reference pulse signals may have the same as frequency.

The touch electrode driving signal, based on the first reference pulse signal, and the one or more pulse signals, based on the other reference pulse signals, may have corresponding phases.

The microcontroller may output the first reference pulse signal and the other reference pulse signals having different phases.

The microcontroller may output a second reference pulse signal different from the first reference pulse signal, and the gate driver circuit may receive a low-level gate voltage, which is a pulse signal based on the second reference pulse signal.

The touch electrode driving signal, based on the first reference pulse signal, and the low-level gate voltage, based on the second reference pulse signal, may have the same frequency.

The touch electrode driving signal, based on the first reference pulse signal, and the low-level gate voltage, based on the second reference pulse signal, may have the same phase.

The first reference pulse signal and the second reference pulse signal may have different phases.

The microcontroller may delay the output of the first reference pulse signal, so that the first reference pulse signal is later than the second reference pulse signal.

The microcontroller may output a third reference pulse signal different from the first reference pulse signal.

While the touch electrode driving signal, based on the first reference pulse signal, is being applied to the one or more touch electrodes among the plurality of touch electrodes, a pulse signal, based on the third reference pulse signal, may be applied to touch electrodes other than the one or more touch electrodes, among the plurality of touch electrodes.

The first reference pulse signal and the third reference pulse signal may have the same frequency.

The touch electrode driving signal, based on the first reference pulse signal, and the pulse signal, based on the third reference pulse signal, may have the same phase.

The first reference pulse signal and the third reference pulse signal may have different phases.

The microcontroller may delay the output of the first reference pulse signal, so that the first reference pulse signal is later than the third reference pulse signal.

The microcontroller may output a fourth reference pulse signal different from the first reference pulse signal.

While the touch electrode driving signal, based on the first reference pulse signal, is being applied to the one or more touch electrodes, the data driver circuit may output an image-displaying data signal in response to a gamma reference voltage, which is a pulse signal based on the fourth reference pulse signal.

The touch electrode driving signal, based on the first reference pulse signal, and the gamma reference voltage, based on the fourth reference pulse signal, may have the same frequency.

The touch electrode driving signal, based on the first reference pulse signal, and the gamma reference voltage, based on the fourth reference pulse signal, may have the same phase.

The first reference pulse signal and the fourth reference pulse signal may have different phases.

The microcontroller may delay the output of the first reference pulse signal, so that the first reference pulse signal is later than the fourth reference pulse signal.

The microcontroller may output a fifth reference pulse signal different from the first reference pulse signal. The gate driver circuit may receive a high-level gate voltage, which is a pulse signal based on the fifth reference pulse signal.

The touch electrode driving signal, based on the first reference pulse signal, and the high-level gate voltage, based on the fifth reference pulse signal, may have the same frequency.

The touch electrode driving signal, based on the first reference pulse signal, and the high-level gate voltage, based on the fifth reference pulse signal, may have the same phase.

The first reference pulse signal and the fifth reference pulse signal may have different phases.

The microcontroller may delay the output of the first reference pulse signal, so that the first reference pulse signal is later than the fifth reference pulse signal.

The microcontroller may output a sixth reference pulse signal different from the first reference pulse signal. The gate driver circuit may receive a gate clock signal, which is a pulse signal based on the sixth reference pulse signal.

The touch electrode driving signal, based on the first reference pulse signal, and the gate clock signal, based on the sixth reference pulse signal, may have the same frequency.

The touch electrode driving signal, based on the first reference pulse signal, and the gate clock signal, based on the sixth reference pulse signal, may have the same phase.

The first reference pulse signal and the sixth reference pulse signal may have different phases.

The microcontroller may delay the output of the first reference pulse signal, so that the first reference pulse signal is later than the sixth reference pulse signal.

The microcontroller may output the two or more reference pulse signals by adjusting phase differences between the two or more reference pulse signals, based on a propagation time of each of the two or more reference pulse signals stored in a register or propagation time differences between the two or more reference pulse signals.

The touch display device may further include two or more feedback lines extending from output points of two or more of the data driver circuit, the gate driver circuit, the touch driver circuit, and the touch power circuit to the microcontroller.

The microcontroller may output the two or more reference pulse signals or two or more dedicated test signals corresponding to the two or more reference pulse signals.

The microcontroller may receive two or more feedback pulse signals regarding the two or more reference pulse signals or the two or more dedicated test signals through the two or more feedback lines, determine the propagation time of each of the two or more reference pulse signals or the propagation time differences between the two or more reference pulse signals, based on the two or more feedback pulse signals, and store the propagation time or the propagation time differences in the register.

According to another aspect, provided is a microcontroller mounted on a printed circuit board of a touch display device including a display panel and the printed circuit board electrically connected to the display panel.

The microcontroller may include: a register storing information regarding two or more reference pulse signals; and a signal generator generating and outputting two or more reference pulse signals having the same frequency.

The signal generator may generate phase differences between the two or more reference pulse signals, so that a plurality of pulse signals generated by external signal supply components, based on the two or more reference pulse signals, have the same phase on the display panel or the printed circuit board.

The signal generator may output the two or more reference pulse signals by adjusting the phase differences between the two or more reference pulse signals, based on a propagation time of each of the two or more reference pulse signals stored in the register or propagation time differences between the two or more reference pulse signals.

The microcontroller may further include an automatic compensator determining the propagation time of each of the two or more reference pulse signals or the propagation time differences between the two or more reference pulse signals, and storing the propagation time or the propagation time differences in the register.

The microcontroller may further include a clock counter determining the propagation time differences between the two or more reference pulse signals, based on fine clocks, or creating a phase difference between the two or more reference pulse signals, based on the fine clocks.

According to another aspect, provided is a method of driving a touch display device including a display panel in which a plurality of data lines, a plurality of gate lines, and a plurality of touch electrodes are disposed, a touch driver circuit driving the plurality of touch electrodes, a printed circuit board electrically connected to the display panel, and a microcontroller mounted on the printed circuit board.

The method of driving the touch display device may include: outputting, by the microcontroller, a first reference pulse signal and one or more other reference pulse signals having the same frequency; and applying, by the touch driver circuit, a touch electrode driving signal, which is a pulse signal based on the first reference pulse signal, to one or more touch electrodes among the plurality of touch electrodes.

In the application of the touch electrode driving signal, one or more pulse signals based on the other reference pulse signals may be applied to the display panel or the printed circuit board while the touch electrode driving signal is being applied to the one or more touch electrodes.

The first reference pulse signal and the other reference pulse signals may have the same as frequency.

The touch electrode driving signal, based on the first reference pulse signal, and the one or more pulse signals, based on the other reference pulse signals, may have corresponding phases.

In the outputting of the first reference pulse signal and the one or more other reference pulse signals, the first reference pulse signal and the other reference pulse signals may have different phases.

The microcontroller may delay the outputting of the first reference pulse signal, so that the first reference pulse signal is later than the other reference pulse signals.

According to exemplary embodiments, the touch display device, the microcontroller, and the driving method can prevent unnecessary parasitic capacitance from being generated between one or more touch electrodes, among the plurality of touch electrodes, to which a driving signal is applied for the touch sensing, and other surrounding electrodes.

According to exemplary embodiments, the touch display device, the microcontroller, and the driving method can prevent a phase difference between a touch electrode driving signal and a variety of other pulse signals in the panel driving for the touch sensing.

According to exemplary embodiments, the touch display device, the microcontroller, and the driving method can simultaneously perform the display processing and the touch sensing, and in the driving for the display processing and the touch sensing, prevent phase differences among a variety of pulses generated by the display panel, the printed circuit board, etc.

According to exemplary embodiments, the touch display device, the microcontroller, and the driving method can generate a variety of pulse signals necessary for the driving, on the basis of reference pulse signals having a variety of phase differences, and use the variety of generated pulse signals in the driving, thereby preventing phase differences among the variety of pulse signals generated by the display panel, the printed circuit board, and the like, during the driving in which the display processing and the touch sensing are simultaneously performed.

BRIEF DESCRIPTION OF THE SEVERAL VIEWS OF THE DRAWINGS

The above and other objects, features, and advantages of the present disclosure will be more clearly understood from the following detailed description, taken in conjunction with the accompanying drawings, in which:

FIG. 7B illustrates various timings of finger sensing and pen sensing according to the time-free driving method in the touch display device according to exemplary embodiments;

FIG. 8 illustrates touch electrode driving signals according to the three cases of time-free driving in the touch display device according to exemplary embodiments;

DETAILED DESCRIPTION

Figure 1:
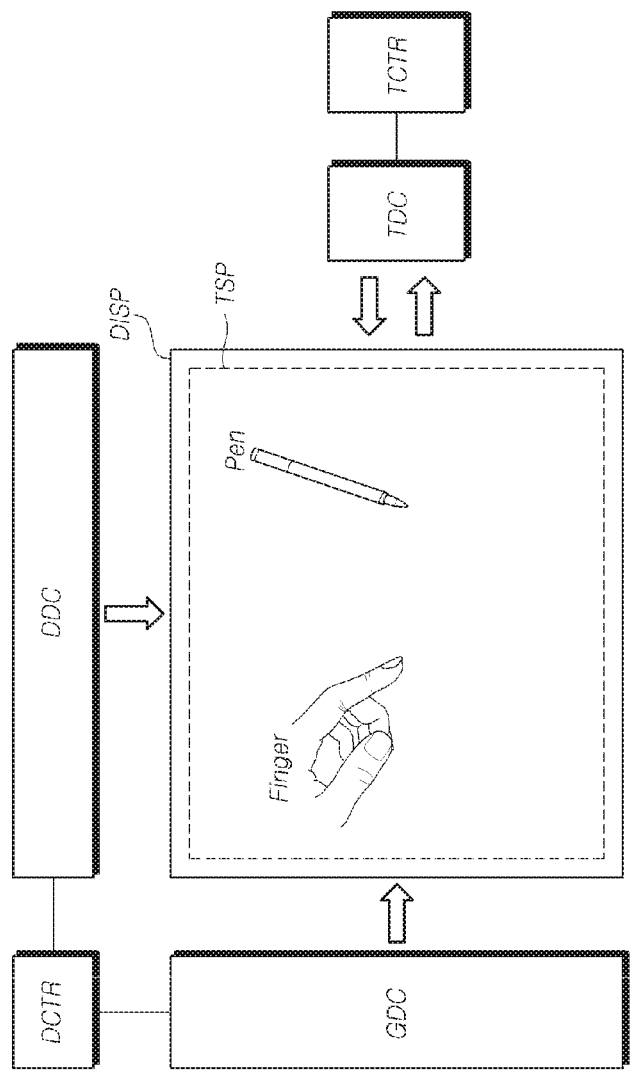
FIG. 1 illustrates a schematic system configuration of a touch display device according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated into the present disclosure will be omitted in the case that the subject matter of the present disclosure may be rendered unclear thereby.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element.

Figure 2:
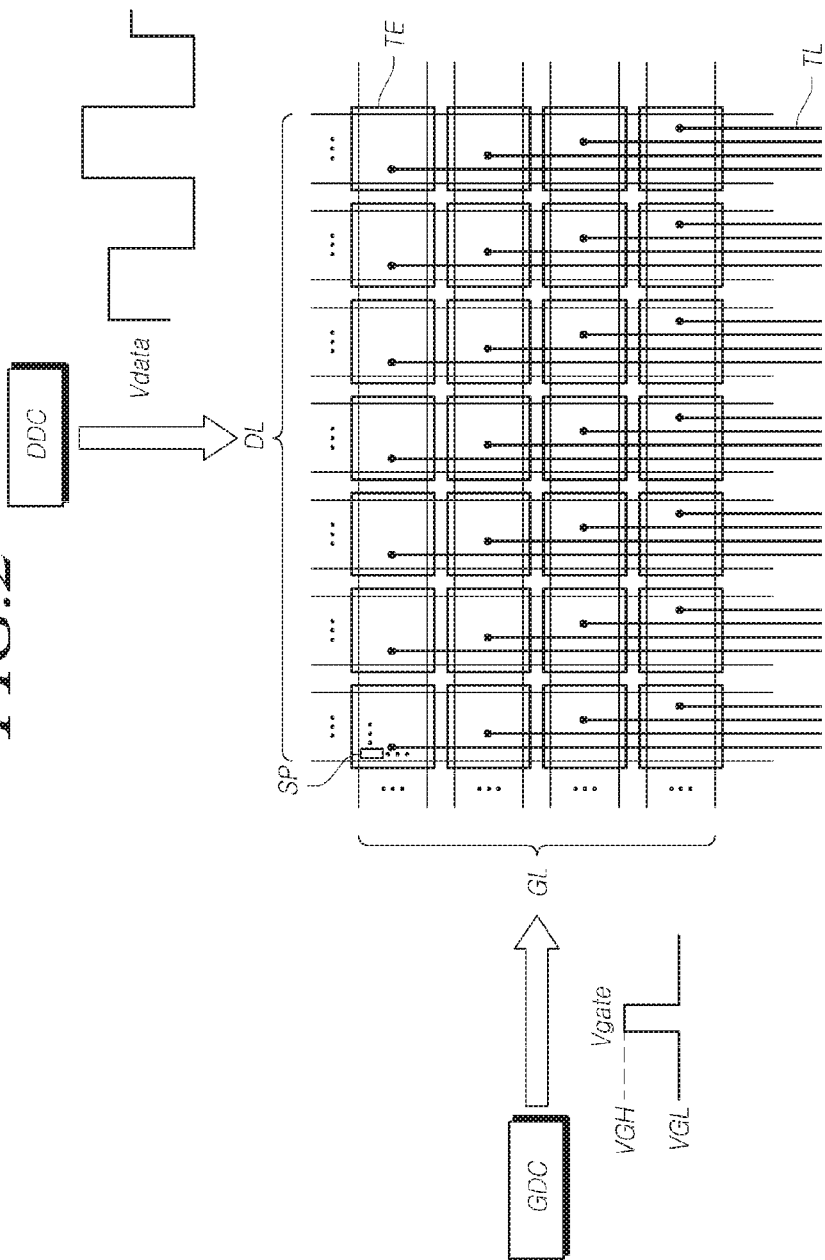
FIG. 2 schematically illustrates display driving of the touch display device according to exemplary embodiments.
Figure 3:
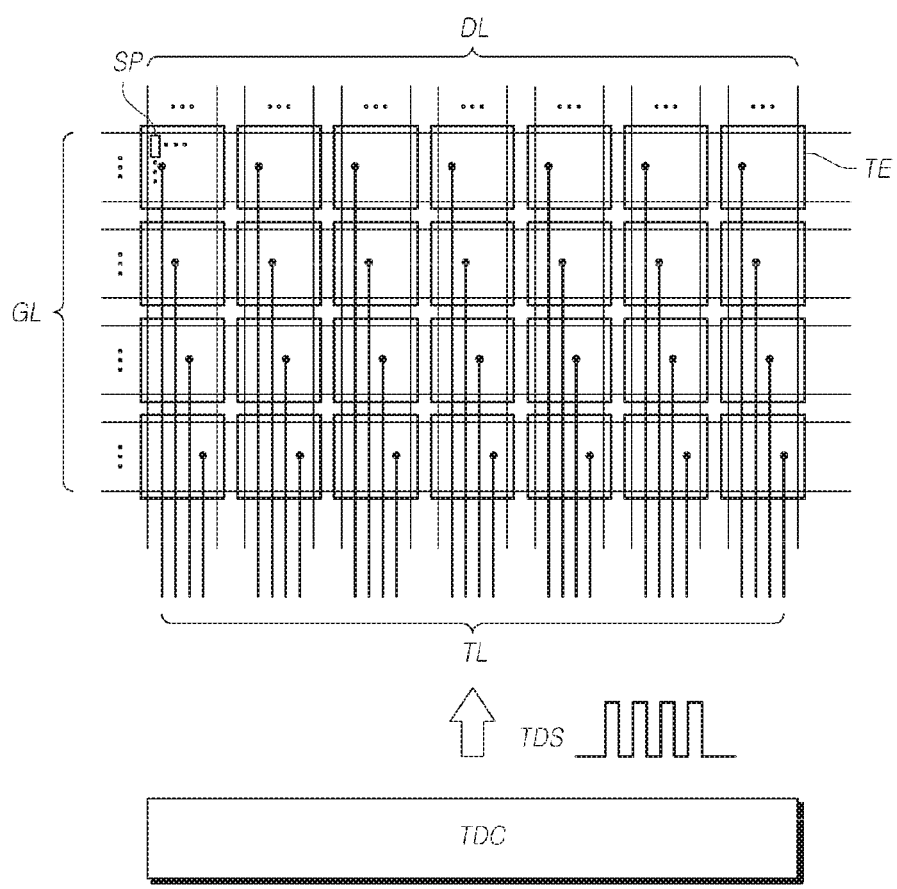
FIG. 3 schematically illustrates touch driving of the touch display device according to exemplary embodiments.

FIG. 1 illustrates a schematic system configuration of a touch display device according to exemplary embodiments, FIG. 2 schematically illustrates display driving of the touch display device according to exemplary embodiments, and FIG. 3 schematically illustrates touch driving of the touch display device according to exemplary embodiments.

Referring to FIG. 1, the touch display device according to exemplary embodiments may provide a display function to display images. In addition, the touch display device according to exemplary embodiments may provide a touch sensing function to detect a user's touch and a touch input function to perform input processing in response to the user's touch, using the result of detecting the user's touch.

Hereinafter, display driving components and display driving will be described with reference to FIGS. 1 and 2, and touch sensing components and touch driving will be described with reference to FIGS. 1 and 3.

Referring to FIGS. 1 and 2, in order to provide the display function, the touch display device according to exemplary embodiments may include: a display panel DISP in which a plurality of data lines DL and a plurality of gate lines GL are disposed and a plurality of subpixels SP defined by the plurality of data lines DL and the plurality of gate lines GL are arrayed; a data driver circuit DDC electrically connected to the display panel DISP to drive the plurality of data lines DL; a gate driver circuit GDC electrically connected to the display panel DISP to drive the plurality of gate lines GL; and a display controller DCTR controlling the data driver circuit DDC and the gate driver circuit GDC.

The display controller DCTR controls the data driver circuit DDC and the gate driver circuit GDC by supplying a variety of control signals to the data driver circuit DDC and the gate driver circuit GDC.

The display controller DCTR starts scanning in the timing realized by respective frames, converts externally-input image data into output image data having a data signal format readable by the data driver circuit DDC, outputs the output image data, and controls data driving at appropriate points in time according to the scanning.

The gate driver circuit GDC sequentially supplies a gate signal having an on or off voltage to the plurality of gate lines GL, under the control of the display controller DCTR.

When a specific gate line GL is opened by the gate driver circuit GDC, the data driver circuit DDC converts the output image data, received from the display controller DCTR, into an analog image signal, and supplies a data signal Vdata, corresponding to the analog image signal, to the plurality of data lines DL.

The display controller DCTR may be a timing controller used in typical display technology, may be a control device including a timing controller and performing other control functions, or may be a control device different from the timing controller.

The display controller DCTR may be provided as a component separate from the data driver circuit DDC, or may be provided in combination with the data driver circuit DDC to form an integrated circuit (IC).

The data driver circuit DDC drives the plurality of data lines DL by supplying the data signal Vdata to the plurality of data lines DL. Herein, the data driver circuit DDC is also referred to as a "source driver."

The data driver circuit DDC may include one or more source driver ICs (SDICs). Each of the source driver ICs may include a shift register, a latch circuit, a digital-to-analog converter (DAC), an output buffer, etc. In some cases, the source driver IC may further include an analog-to-digital converter (ADC).

Each of the source driver ICs may be connected to a bonding pad of the display panel DISP by a tape-automated bonding (TAB) method or a chip-on-glass (COG) method, may be directly mounted on the display panel DISP, or in some cases, may be integrated with the display panel DISP. In addition, each of the source driver ICs may be implemented using a chip-on-film (COF) structure mounted on a film connected to the display panel DISP.

The gate driver circuit GDC sequentially drives the plurality of gate lines GL by sequentially supplying the scan signal Vgate (also referred to as a scan voltage, a gate signal, or a gate voltage) to the plurality of gate lines GL. Herein, the gate driver circuit GDC is also referred to as a "scan driver."

Here, the scan signal Vgate is comprised of an off-level gate voltage by which the corresponding gate line GL is closed and an on-level gate voltage by which the corresponding gate line GL is opened.

More specifically, the scan signal Vgate is comprised of an off-level gate voltage, by which a transistor connected to the corresponding gate line GL is turned off, and an on-level gate voltage, by which a transistor connected to the corresponding gate line GL is turned on.

In a case in which the transistor is an n-type transistor, the off-level gate voltage may be a low-level gate voltage VGL, and the on-level gate voltage may be a high-level gate voltage VGH. If a case in which the transistor is a p-type transistor, the off-level gate voltage may be a high-level gate voltage VGH, and the on-level gate voltage may be a low-level gate voltage VGL. Hereinafter, for the sake of brevity, the off-level gate voltage will be described as being the low-level gate voltage and the on-level gate voltage will be described as being the high-level gate voltage by way of example.

The gate driver circuit GDC may include one or more gate driver ICs (GDICs). Each of the gate driver ICs may include a shift register, a level shifter, etc.

Each of the gate driver circuit GDC may be connected to a bonding pad of the display panel DISP by a TAB method or a COG method, may be implemented using a gate-in-panel (GIP) structure directly mounted on the display panel DISP, or in some cases, may be integrated with the display panel DISP. In addition, each of the gate driver circuit may be implemented using a COF structure mounted on a film connected to the display panel DISP.

The data driver circuit DDC may be disposed on one side of the display panel DISP (e.g., in the upper portion or the lower portion of the display panel DISP or above or below the display panel DISP), as illustrated in FIG. 1. In some cases, the data driver DDR may be disposed on both sides of the display panel DISP (e.g., in the upper portion and the lower portion of the display panel DISP or above and below the display panel DISP), depending on the driving system, the design of the display panel, etc.

The gate driver circuit GDC may be disposed on one side of the display panel DISP (e.g., in the right portion or the left portion of the display panel DISP or to the right or left of the display panel DISP), as illustrated in FIG. 1. In some cases, the gate driver circuit GDC may be disposed on both sides of the display panel DISP (e.g., in the right portion and the left portion of the display panel DISP or to the right and left of the display panel DISP), depending on the driving system, the design of the display panel, or the like.

The touch display device according to exemplary embodiments may be one of various types of display device, such as a liquid crystal display (LCD) device or an organic light-emitting display device. The display panel DISP according to exemplary embodiments may be one of various types of display panel, such as an LCD panel and an organic light-emitting display panel.

Each of the subpixels SP arrayed in the display panel DISP may include one or more circuit elements (e.g., a transistor or capacitor).

For example, in a case in which the display panel DISP is an LCD panel, a pixel electrode may be disposed in each of the subpixels SP, and a transistor may be electrically connected between the pixel electrode and the corresponding data line DL. The transistor may be turned on by the scan signal Vgate, supplied to a gate electrode through the gate line GL. When turned on, the transistor may output the data signal Vdata, supplied to a source electrode (or a drain electrode) through the data line DL, to the drain electrode (or the source electrode), so that the data signal Vdata is applied to the pixel electrode electrically connected to the drain electrode (or the source electrode). An electric field may be generated between the pixel electrode to which the data signal Vdata is applied and the common electrode COM to which a common voltage Vcom is applied, and capacitance may be generated between the pixel electrode and the common electrode COM.

The structure of each of the subpixels SP may be variously determined, depending on the panel type, the function provided by the panel, the design, etc.

Referring to FIGS. 1 and 3, the touch display device according to exemplary embodiments may include a touchscreen panel TSP, a touch driver circuit TDC electrically connected to the touchscreen panel TSP to drive and sense the touchscreen panel TSP, a touch controller TCTR detecting a touch using a result obtained from the touch driver circuit TDC sensing the touchscreen panel TSP, etc.

In a touch performed by a user using a pointer, the pointer may approach or contact the touchscreen panel TSP. Touch sensors may be disposed on the touchscreen panel TSP.

The term "pointer" used herein may mean a finger, a pen, etc.

The pen may be a passive pen without a signal transmitting and receiving function or an active pen having a signal transmitting and receiving function. The touch driver circuit TDC may supply a touch electrode driving signal (also referred to as a touch driving signal) to the touchscreen panel TSP, and perform sensing on the touchscreen panel TSP. The touch controller TCTR may detect a touch according to the result of the sensing on the touchscreen panel TSP performed by the touch driver circuit TDC. Herein, the operation of detecting a touch may mean determining at least one of whether or not a touch has been performed or touch coordinates.

The touchscreen panel TSP may be an external panel disposed externally of the display panel DISP or an embedded panel disposed within the display panel DISP.

In a case in which the touchscreen panel TSP is an external panel, the touchscreen panel TSP and the display panel DISP may be combined using an adhesive or the like after being separately fabricated. The external touchscreen panel TSP is also referred to as an add-on touchscreen panel.

In a case in which the touchscreen panel TSP is an embedded panel, the touchscreen panel TSP may be simultaneously fabricated during the fabrication process of the display panel DISP. That is, touch sensors of the touchscreen panel TSP may be disposed within the display panel DISP. The embedded touchscreen panel TSP may be an in-cell touchscreen panel, an on-cell touchscreen panel, a hybrid touchscreen panel, etc.

Hereinafter, for the sake of brevity, the touchscreen panel TSP will be taken as an embedded touchscreen panel disposed within the display panel DISP.

In a case in which the touchscreen panel TSP is embedded in the display panel DISP, i.e., a plurality of touch electrodes TE are disposed in the display panel DISP, the plurality of touch electrodes TE may be provided in the display panel DISP separately from electrodes used in the display driving, or electrodes disposed in the display panel DISP for the display driving may be used as the plurality of touch electrodes TE.

For example, common electrodes disposed in the display panel DISP may be divided into a plurality of pieces to be used as the plurality of touch electrodes TE. That is, the plurality of touch electrodes TE disposed in the display panel DISP may serve as display-driving electrodes while still being touch sensing electrodes. Hereinafter, the plurality of touch electrodes TE disposed in the display panel DISP will be taken as common electrodes.

The touch controller TCTR may be implemented, for example, as a microcontroller (MCU), a processor, etc.

The display controller DCTR and the touch controller TCTR may be provided separately or in combination with each other.

Referring to FIG. 3, the plurality of touch electrodes TE are disposed in the touchscreen panel TSP of the touch display device according to exemplary embodiments, and a plurality of touch lines TL, electrically connecting the plurality of touch electrodes TE to the touch driver circuit TDC, may be disposed. One or more touch lines TL may be electrically connected to each of the touch electrodes TE through one or more contact holes.

The touch display device according to exemplary embodiments may detect a touch using self-capacitance of the touch electrodes or mutual capacitance between the touch electrodes TE.

In a case in which the touch display device according to exemplary embodiments detects a touch using self-capacitance, a plurality of first touch electrode lines and a plurality of second touch electrode lines may be disposed in the touchscreen panel TSP in an intersecting manner. For example, the plurality of first touch electrode lines may be disposed in the X-axis direction, while the plurality of second touch electrode lines may be disposed in the Y-axis direction. Here, each of the first touch electrode lines and the second touch electrode lines may be a single bar-shaped touch electrode or two or more touch electrode sections electrically connected to each other. The first touch electrode lines may be referred to as driving lines, driving electrodes, driving touch electrode lines, Tx lines, Tx electrodes, Tx touch electrode lines, etc., while the second touch electrode lines may be referred to as receiving lines, receiving electrodes, receiving touch electrode lines, sensing lines, sensing electrodes, sensing touch electrode lines, Rx lines, Rx electrodes, Rx touch electrode lines, etc.

In this case, the touch driver circuit TDC may supply a driving signal to one or more first touch electrode lines among the plurality of first touch electrode lines and output sensing data by sensing the second touch electrode lines, while the touch controller TCTR may determine at least one of a touch or touch coordinates using the sensing data.

In a case in which the touch display device according to exemplary embodiments detects a touch using mutual capacitance, the plurality of touch electrodes TE may be disposed in the touchscreen panel TSP, in a form in which the plurality of touch electrodes TE are divided from each other.

In this case, the touch driver circuit TDC may supply a driving signal (hereinafter, referred to as a touch electrode driving signal) TDS to one or more touch electrodes TE among the plurality of touch electrodes TE, output sensing data by sensing the one or more touch electrodes TE to which the driving signal has been supplied, and determine at least one of a touch or touch coordinates using the sensing data.

Hereinafter, for the sake of brevity, the touch display device according to exemplary embodiments will be described regarding a case in which touch sensing is based on self-capacitance, and in which the touchscreen panel TSP is configured as illustrated in FIGS. 2 and 3.

The touch electrode driving signal TDS, output from the touch driver circuit TDC, may be a constant voltage signal or a variable voltage signal.

In a case in which the touch electrode driving signal TDS is a variable voltage signal, the touch electrode driving signal TDS may be any of various signal waveforms, such as a sine wave, a triangular wave, and a square wave.

Hereinafter, in a case in which the touch electrode driving signal TDS is a variable voltage signal, the touch electrode driving signal TDS will be regarded as a pulse signal composed of a plurality of pulses. In a case in which the touch electrode driving signal TDS is a pulse signal composed of a plurality of pulses, the touch electrode driving signal TDS may have a constant frequency or a variable frequency.

Referring to FIGS. 2 and 3, the size of an area occupied by a single touch electrode TE may correspond to the size of an area occupied by a single subpixel SP or the size of an area occupied by two or more subpixels SP.

A plurality of touch electrodes TE are arrayed in a single touch electrode column. Here, a plurality of touch lines TL electrically connected to the plurality of touch electrodes TE may overlap the plurality of touch electrodes TE. For example, in a case in which a plurality of touch electrodes TE arrayed in a single touch electrode column include a first touch electrode and a second touch electrode, a first touch line connected to the first touch electrode may be electrically disconnected from the second touch electrode while overlapping the second touch electrode.

Figure 4:
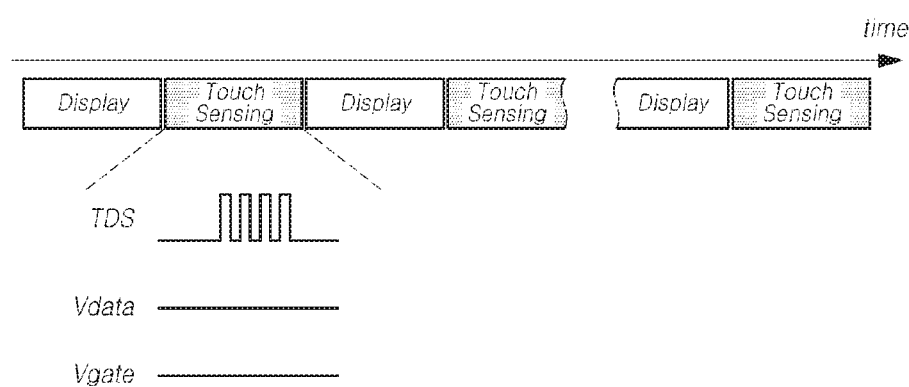
FIGS. 4 and 5 illustrate time division driving performed in the touch display device according to exemplary embodiments.
Figure 5:
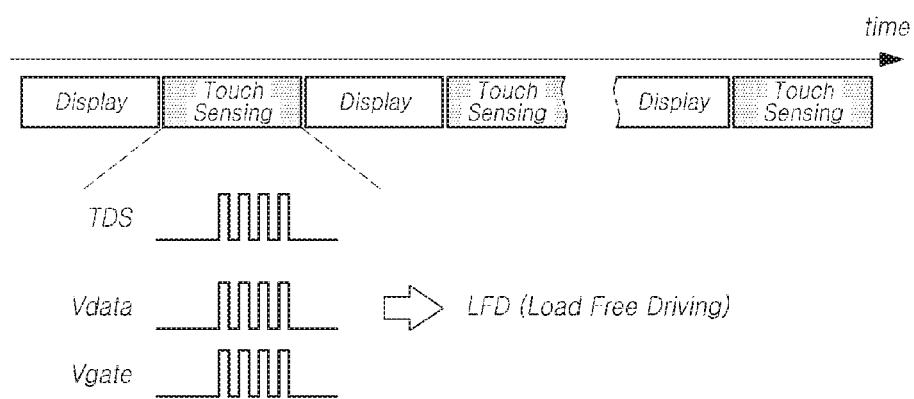

FIGS. 4 and 5 illustrate time division driving (TDD) performed in the touch display device according to exemplary embodiments.

Referring to FIG. 4, the touch display device according to exemplary embodiments may alternately perform display processing and touch sensing. Such a method of alternately performing display driving for the display processing and touch driving for the touch sensing is referred to as a time division driving (TDD) method.

According to the time division driving method, a display period for the display processing and a touch sensing period for the touch sensing alternate with each other. During the display period, the touch display device may perform the display driving. During the touch sensing period, the touch display device may perform the touch driving.

In an example of the time division driving method, a one-frame period may be divided into a single display period and a single touch sensing period. In another example of the time division driving method, the one-frame period may be divided into two or more display periods and one or more touch sensing periods.

Referring to FIG. 4, according to the time division driving method, during the touch sensing period, the touch electrode driving signal TDS may be applied to one or more touch electrodes TE among the plurality of touch electrodes TE. In this case, either the plurality of data lines DL or the plurality of gate lines GL may not be driven.

In this case, due to a potential difference, unnecessary parasitic capacitance may be generated between a touch electrode TE, to which the touch electrode driving signal TDS is applied, and one or more data lines DL located adjacent thereto. Such unnecessary parasitic capacitance may increase resistance-capacitance (RC) delay in the corresponding touch electrode TE and the touch line TL connected thereto, thereby lowering touch sensitivity.

In addition, unnecessary parasitic capacitance may be generated between a touch electrode TE, to which the touch electrode driving signal TDS is applied, and one or more gate lines GL located adjacent thereto, due to a potential difference. Such unnecessary parasitic capacitance may increase resistance-capacitance (RC) delay in the corresponding touch electrode TE and the gate line GL connected thereto, thereby lowering touch sensitivity.

In addition, unnecessary parasitic capacitance may be generated between a touch electrode TE, to which the touch electrode driving signal TDS is applied, and one or more other touch electrode TE located adjacent thereto, due to a potential difference. Such unnecessary parasitic capacitance may increase resistance-capacitance (RC) delay in the adjacent touch electrodes TE, thereby lowering touch sensitivity.

The RC delay described above may also be referred to as time constant or load.

In order to remove the load, the touch display device according to exemplary embodiments may perform load free driving (LFD) during the touch sensing period.

In the load free driving, when the touch electrode driving signal TDS is applied to the entirety or a portion of the plurality of touch electrodes TE, the touch display device according to exemplary embodiments may apply a load free driving (LFD) signal to the entirety of the plurality of data lines DL or a portion of the plurality of data lines DL, which may cause parasitic capacitance, as a data signal Vdata.

In the load free driving, when the touch electrode driving signal TDS is applied to the entirety or a portion of the plurality of touch electrodes TE, the touch display device according to exemplary embodiments may apply the LFD signal to the entirety of the plurality of gate lines GL or a portion of the plurality of gate lines GL, which may cause parasitic capacitance, as a gate signal Vgate.

In the load free driving, when the touch electrode driving signal TDS is applied to the entirety or a portion of the plurality of touch electrodes TE, the touch display device according to exemplary embodiments may apply the LFD signal to the entirety of the remaining touch electrodes TE or a portion of the remaining touch electrodes TE, which may cause parasitic capacitance.

The LFD signal may be a touch electrode driving signal or a signal, characteristic of which are the same as or similar to those of the touch electrode driving signal.

For example, the frequency and phase of the LFD signal may be the same as or within a predetermined error range (or predetermined tolerance range) from those of the touch electrode driving signal TDS. In addition, the amplitude of the LFD signal may be the same as or within a predetermined error range from that of the touch electrode driving signal TDS. In some cases, the amplitude of the LFD signal may have an intended difference from that of the touch electrode driving signal TDS.

Figure 6:
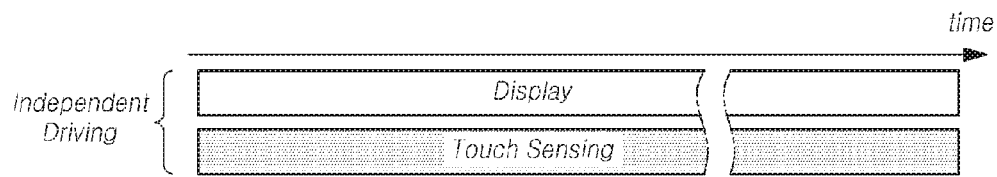
FIG. 6 illustrates time-free driving of the touch display device according to exemplary embodiments.

FIG. 6 illustrates time-free driving (TFD) of the touch display device according to exemplary embodiments.

Referring to FIG. 6, the touch display device according to exemplary embodiments can perform display processing and touch sensing independently of each other. Such a driving method of performing display driving for the display processing and touch driving for the touch sensing independently of each other is referred to as a time-free driving (TFD) method.

According to the time-free driving method, the display driving for the display processing and the touch driving for the touch sensing may be simultaneously performed. In addition, in a specific period, the display driving for the display processing or the touch driving for the touch sensing may only be performed.

Figure 7A:
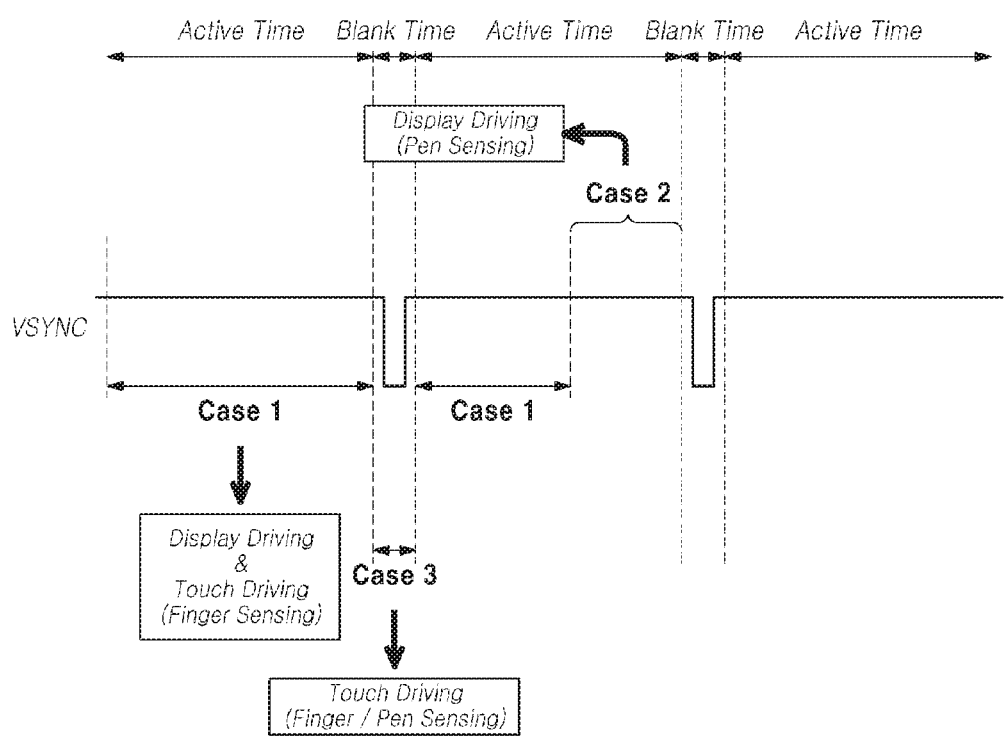
FIG. 7A illustrates three cases of time-free driving in a case in which the touch display device according to exemplary embodiments operates according to the time-free driving method.

FIG. 7A illustrates three cases of time-free driving Case 1, Case 2, Case 3 in a case in which the touch display device according to exemplary embodiments performs time-free driving, FIG. 7B illustrates various timings of finger sensing F/S and pen sensing P/S according to the time-free driving method in the touch display device according to exemplary embodiments, and FIG. 8 illustrates touch electrode driving signals TDS according to the three cases of time-free driving Case 1, 2, and 3 in the touch display device according to exemplary embodiments.

According to the first case of time-free driving Case 1, the touch display device may simultaneously perform the display driving and the touch driving.

In Case 1, the touch display device may supply the touch electrode driving signal TDS having a variable voltage to the touch electrodes TE in order to perform the touch driving.

Hereinafter, in Case 1, the touch electrode driving signal TDS applied to the touch electrodes TE will be referred to as a first touch electrode driving signal TDS1. The first touch electrode driving signal TDS1 will has a first amplitude AMP1.

In Case 1, the touch display device may detect a finger touch, performed by touching the touchscreen panel TSP with a finger, by performing the touch driving. Such touch detection is also referred to as finger sensing.

In addition, in Case 1, in a case in which a finger or a pen has approached the touchscreen panel TSP without contacting the touchscreen panel TSP, the touch display device may detect a finger touch or a pen touch by performing the touch driving. Such touch detection is referred to as hover sensing.

According to the second case of time-free driving Case 2, the touch display device may perform only the display driving.

In Case 2, the touch display device does not perform typical touch driving, since it is not required to detect a finger touch. That is, the touch display device does not supply the touch electrode driving signal TDS having a variable voltage to the plurality of touch electrodes TE disposed in the touchscreen panel TSP.

In Case 2, the touch display device may supply touch electrode driving signal TDS in the form of a direct current (DC) voltage. Hereinafter, in Case 2, the touch electrode driving signal TDS applied to the touch electrodes TE will also be referred to as a second touch electrode driving signal TDS2.

In addition, in Case 2, the touch display device may detect the pen by receiving a pen signal output from the pen. The touch display device may obtain various pieces of information regarding the pen, such as position, tilt, pressure (writing pressure), or various additional pieces of information, as a result of the pen sensing.

According to the third case of time-free driving Case 3, the touch display device may perform only the touch driving.

In Case 3, the touch display device may supply the touch electrode driving signal TDS in the form of a variable voltage in order to perform the touch driving.

Hereinafter, in Case 3, the touch electrode driving signal TDS applied to the touch electrodes TE will be referred to as a third touch electrode driving signal TDS3. The third touch electrode driving signal TDS3 has a third amplitude AMP3 different from the first amplitude AMP1.

In Case 3, the touch display device may detect a finger touch on the touchscreen panel TSP by performing the touch driving.

Referring to FIG. 7A, in the touch display device, the three cases of time-free driving Case 1, Case 2, and Case 3, Case 1 may be performed during an active period (or active time), while Case 3 may be performed during a blank period (or blank time). The active period may correspond to a period of time in which a screen of one frame is displayed, while the blank period may correspond to a period of time after the screen of a single frame has been displayed and before the screen of the next frame starts to be displayed.

Referring to FIG. 7A, during the active period, Case 1 may be changed to Case 2.

Referring to FIG. 7A, during the active period, the touch display device may perform both the display driving and the touch driving (Case 1) and then stop the touch driving for the finger sensing in order to perform only the display driving or perform the pen sensing instead of the finger sensing (Case 1 changed to Case 2).

In Case 1 and Case 3, in the touch driving for the finger sensing, the touch electrode driving signal TDS1 having the amplitude AMP1 and the touch electrode driving signal TDS1 having the amplitude TDS3 may be applied to the touch electrodes TE.

In Case 2, the touch electrode driving signal TDS2 in the form of a DC voltage may be applied to the touch electrodes TE, so that the pen sensing is performed together with the display driving.

In addition, referring to FIG. 8, the first amplitude AMP1 of the first touch electrode driving signal TDS1, applied to the touch electrodes TE in a case in which both the display driving and the touch driving are performed (Case 1), may be smaller than the third amplitude AMP3 of the third touch electrode driving signal TDS3 applied to the touch electrodes TE in a case in which only the touch driving is performed (Case 3).

The first amplitude AMP1 of the first touch electrode driving signal TDS1, applied to the touch electrodes TE during the active period, may be smaller than the third amplitude AMP3 of the third touch electrode driving signal TDS3 applied to the touch electrodes TE during the blank period.

Figure 9:
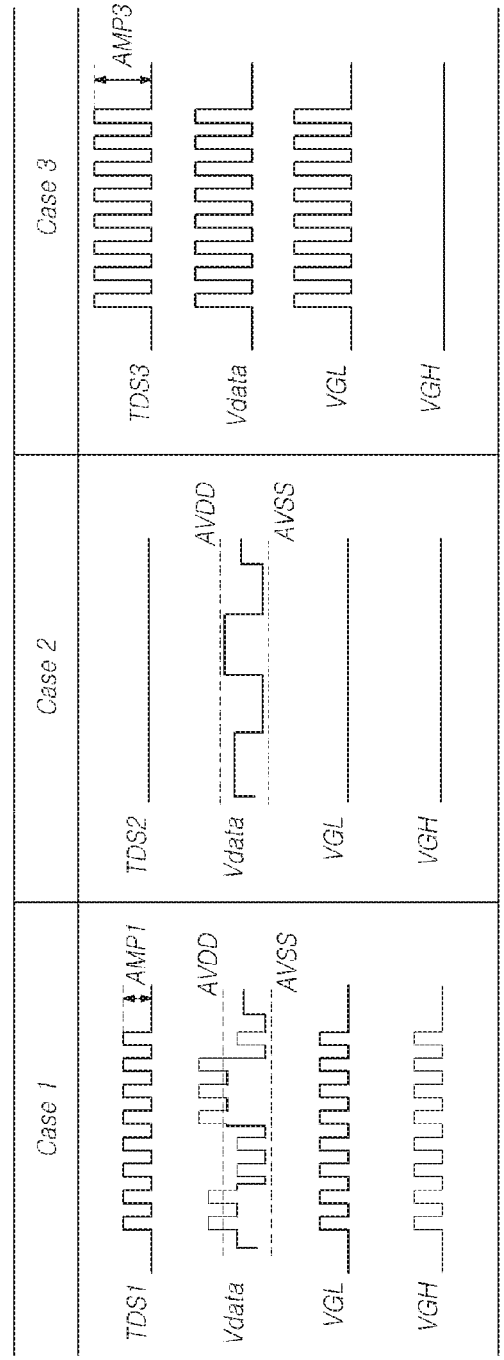
FIG. 9 illustrates signal waveforms of major signals according to the three cases of time-free driving in the touch display device according to exemplary embodiments.

Referring to FIGS. 7A and 9, during the active period, the touch driver circuit TDC may supply the first touch electrode driving signal TDS1, having the first amplitude AMP1, or the second touch electrode driving signal TDS2, corresponding to a DC voltage, to the plurality of touch electrodes TE.

Referring to FIGS. 7A and 9, during the blank period, the touch driver circuit TDC may supply the third touch electrode driving signal TDS3 having the third amplitude AMP3 to one or more touch electrodes TE among the plurality of touch electrodes TE.

Here, the driving corresponding to Case 1 may be performed during the entirety of a one-frame period or may be performed only in one or more time intervals within the one-frame period. The driving corresponding to Case 2 may be performed during the entirety of all frames or in one or more frames, or may be performed only in one or more time intervals within a one-frame period. In the driving corresponding to Case 3, finger sensing driving or pen sensing driving may be performed.

Referring to FIG. 8, in the touch display device according to exemplary embodiments, according to the time-free driving method, the finger sensing F/S and the pen sensing P/S may be performed in various timings.

For example, as in the ith frame, only the display driving may be performed during a one-frame period, without the finger sensing F/S or pen sensing P/S. This may correspond to Case 2 without the pen sensing P/S.

In addition, as in the jth frame, during a one-frame period, the finger sensing F/S may be performed during necessary time intervals in the one-frame period. This may correspond to Case 1. In addition, during a one-frame period, the pen sensing P/S may be performed during necessary time intervals in the one-frame period. This may correspond to Case 2 without the pen sensing P/S. In addition, during a one-frame period, the finger sensing F/S and the pen sensing P/S may only be performed in non-overlapping time intervals in the one-frame period.

In addition, as in the kth frame, the finger sensing F/S and the pen sensing P/S may only be performed during overlapping time intervals in a one-frame period. In this case, the result of the finger sensing F/S and the result of the pen sensing P/S may be distinguished by the touch controller TCTR, using a predetermined algorithm or sensing position-specific signal analysis.

In addition to the illustrative cases described above, the display processing and the touch sensing (i.e., at least one of finger sensing or pen sensing) may be performed independently of each other in various timings.

FIG. 9 illustrates signal waveforms of major signals TDS1, Vdata, VGL_M, and VGH_M according to the three cases of time-free driving Case 1, Case 2, and Case 3 in the touch display device according to exemplary embodiments.

Case 1 and Case 2 are driving cases during the active period. Case 3 is a driving case during the blank period.

An off-level gate voltage VGL and an on-level gate voltage VGH supplied to the gate driver circuit GDC to generate the touch electrode driving signal TDS applied to the touch electrodes TE, the data signal Vdata applied to the data lines DL, and the scan signal Vgate applied to the gate lines will be described with respect to the above-described three cases.

In Case 2 in which only the display driving is performed during the active period, the touch electrode driving signal TDS applied to the touch electrodes TE corresponds to the second touch electrode driving signal TDS2 in the form of a DC voltage.

The data signal Vdata applied to the data lines DL is a signal corresponding to an analog image signal obtained by digital-analog converting a digital image signal for the display processing. The data signal Vdata may be a pixel voltage applied to a pixel electrode of a corresponding subpixel SP through the data line DL. Here, the data signal Vdata may be changed between a driving voltage AVDD and a base voltage AVSS.

Each of the off-level gate voltage VGL and the on-level gate voltage VGH of the scan signal applied to the gate lines GL is a corresponding DC voltage.

As described above, the touch electrodes TE may also serve as common electrodes for the display driving. Thus, in Case 2 in which only the display driving is performed during the active period, the second touch electrode driving signal TDS2 applied to the touch electrodes TE corresponds to a common voltage for the display processing.

Accordingly, in the corresponding subpixel SP, due to a voltage difference between the data signal Vdata, applied to the pixel electrode through the data line DL, and the second touch electrode driving signal TDS2 serving as a common voltage applied to the touch electrode TE, an electric field may be generated between the pixel electrode and the touch electrode TE, so that intended light can be emitted from the corresponding subpixel SP.

In Case 3 in which only the touch driving is performed during the blank period, the touch electrode driving signal TDS applied to the touch electrode TE is the third touch electrode driving signal TDS3 having the third amplitude AMP3.

During the blank period, the data lines DL may receive the data signal Vdata corresponding to a DC voltage applied thereto, or may be in a floated state. During the blank period, the gate lines GL may receive the scan signal Vgate, i.e., the off-level gate voltage VGL corresponding to a DC voltage, or may be in an electrically-floated state.

If the load free driving is performed during the blank period in which only the touch driving is performed, there may be voltage fluctuations in the data lines DL and the gate lines GL that are similar to those in the touch electrodes TE.

According to the load free driving, during the blank period, the data signal Vdata applied to the data lines DL may be a third touch electrode driving signal TD3 or the load free driving (LFD) signal having similar characteristics (e.g., phase, frequency, or amplitude) to those of the third touch electrode driving signal TD3.

In addition, according to the load free driving, during the blank period, the off-level gate voltage VGL applied to the gate lines GL may be the third touch electrode driving signal TD3 or the load free driving (LFD) signal having similar characteristics (e.g., phase, frequency, or amplitude) to those of the third touch electrode driving signal TD3.

In Case 1 in which both the display driving and the touch driving are performed during the active period, the touch electrode driving signal TDS applied to the touch electrodes TE is the first touch electrode driving signal TDS1 having the first amplitude AMP1.

In Case 1, the first touch electrode driving signal TDS1 is also the common voltage Vcom for the display driving while being the driving signal for the touch sensing.

The first touch electrode driving signal TDS1, applied to the touch electrodes TE, must have a voltage difference from the data signal Vdata corresponding to the pixel voltage for the display processing, the voltage difference being determined for the display processing.

In Case 1 in which the display driving and the touch driving are simultaneously performed, the first touch electrode driving signal TDS1 has two functions (i.e., serves as the driving signal for the touch sensing while serving as the common voltage for the display processing).

Since the common voltage Vcom corresponding to the first touch electrode driving signal TDS1 is a variable voltage instead of being a constant voltage as described above, the data signal Vdata applied to the data lines DL must have an additional voltage change by an amplitude equal to the first amplitude AMP1 of the first touch electrode driving signal TDS1, in addition to the original voltage change, so that each of the data lines DL is not influenced by the touch driving.

This ensures that only the original voltage change for the display processing is present in the voltage difference between the data signal Vdata corresponding to the pixel voltage and the first touch electrode driving signal TDS1 corresponding to the common voltage Vcom, from which a voltage change portion (i.e., the first amplitude AMP1) of the first touch electrode driving signal TDS1 is removed. Thus, the display processing can be performed ordinarily.

Accordingly, the data signal Vdata, of Case 1 in which the display driving and the touch driving are simultaneously performed, may be a combined signal of the data signal Vdata, of a case in which only the display driving is performed (Case 2), and the first touch electrode driving signal TDS1.

Explaining in a different manner, the data signal Vdata, in Case 1 in which the display driving and the touch driving are simultaneously performed, may be a signal obtained by offsetting the original data signal Vdata, of the case in which only the display driving is performed (Case 2), with the first touch electrode driving signal TDS1. Here, the data signal Vdata may experience a voltage change between the driving voltage AVDD and the base voltage AVSS.

Accordingly, the voltage difference between the data signal Vdata and the first touch electrode driving signal TDS1 in Case 1 in which the display driving and the touch driving are simultaneously performed is the same as the voltage difference between the data signal Vdata and the second touch electrode driving signal TDS2 in Case 2 in which only the display driving is performed.

In Case 1, the load free driving may be required, since the display driving and the touch driving are simultaneously performed.

That is, in Case 1, since the display driving and the touch driving are simultaneously performed, it may be necessary to prevent parasitic capacitance from being generated between the touch electrodes TE and the data lines DL due to the touch driving and prevent parasitic capacitance from being generated between the touch electrodes TE and the gate lines GL due to the touch driving.

According to the above description, in Case 1, only a voltage difference for the display processing is present between the touch electrodes TE and the data lines DL and unnecessary parasitic capacitance is not generated by the touch driving, since the voltages of the touch electrodes TE and the data lines DL fluctuate with changes in the voltage of the first touch electrode driving signal TDS1. That is, in Case 1, the load free driving of the data lines DL is essentially performed.

In Case 1, each of the off-level gate voltage VGL and the on-level gate voltage VGH supplied to the gate driver circuit GDC may be the LFD signal, the characteristics (e.g., phase, frequency, or amplitude) thereof being the same as or similar to the third touch electrode driving signal TD3, so that the gate driver circuit GDC can generate a scan signal SCAN to be applied to the gate lines GL.

Hereinafter, the time free driving of the touch display device according to exemplary embodiments will be described in more detail.

Figure 10:
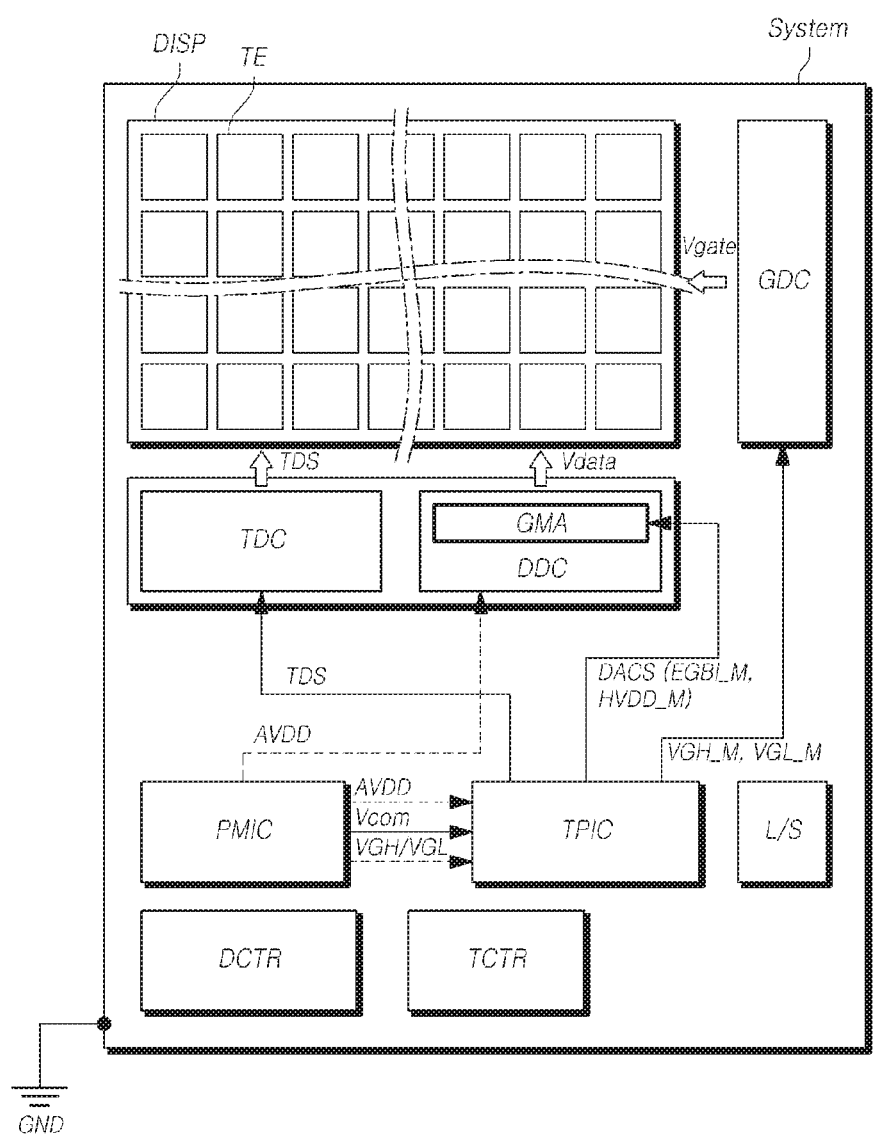
FIG. 10 illustrates a time free driving system of the touch display device according to exemplary embodiments.

FIG. 10 illustrates a time free driving (TFT) system of the touch display device according to exemplary embodiments.

Referring to FIG. 10, the touch display device according to exemplary embodiments may include the following:

The display panel DISP in which the plurality of data lines DL and the plurality of gate lines GL, as well as the plurality of touch electrodes TE are disposed; the gate driver circuit GDC electrically connectable to the plurality of gate lines GL, and driving the plurality of gate lines GL; the data driver circuit DDC electrically connectable to the plurality of data lines DL, and driving the plurality of data lines DL; and the touch driver circuit TDC electrically connectable to the plurality of touch electrodes TE, and driving the plurality of touch electrodes TE.

In addition, the touch display device according to exemplary embodiments may further include: the display controller DCTR controlling the driving operations of the data driver circuit DDC and the gate driver circuit GDC; the touch controller TCTR controlling the driving operation of the touch driver circuit TDC and determining at least one of a touch or touch coordinates using the sensing data output from the touch driver circuit TDC; etc.

In addition, the touch display device according to exemplary embodiments may further include a touch power circuit TPIC serving as a power source, a power management circuit PMIC, etc.

The touch power circuit TPIC may supply an on-level gate voltage VGH_M and an off-level gate voltage VGL_M, necessary for driving the gate lines GL, to the gate driver circuit GDC.

In addition, the touch power circuit TPIC may further supply signals necessary for gate driving, such as two or more gate clock signals, one or more start signals, and one or more reset signals, to the gate driver circuit GDC.

Each of the signals necessary for gate driving, such as gate clock signals, start signals, and reset signals, may be a modulated signal (or pulse signal), generated to correspond to the touch electrode driving signal TDS, or a signal including the modulated signal (or pulse signal). The signal corresponding to the touch electrode driving signal TDS may mean that the frequencies and phases of the signals are the same or the amplitudes of the signals are the same or within an tolerance range.

The touch power circuit TPIC may supply the touch electrode driving signal TDS, necessary for driving the touch electrodes TE, to the touch driver circuit TDC.

In addition, in the point of view of the driving subject of the touch electrodes TE, the touch driver circuit TDC may supply the touch electrode driving signal TDS1 or TDS3, on the basis of the modulated signal (e.g., pulse width modulated signal) received from the touch controller TCTR, to one or more touch electrodes TE subjected to sensing, among the plurality of touch electrodes TE. In addition, the touch power circuit TPIC may also supply the modulated signal (e.g., pulse width modulated signal), received from the touch controller TCTR, to touch electrodes TE not subjected to sensing, among the plurality of touch electrodes TE, as a load free driving signal (i.e., a type of touch electrode driving signal). Here, the touch electrode driving signal TDS1 or TDS3, applied to the touch electrodes TE subjected to sensing, and the load free driving signal (also referable as a touch electrode driving signal), applied to the touch electrodes TE not subjected to sensing, may be the same signals.

The power management circuit PMIC may supply a variety of DC voltages (e.g., AVDD, Vcom, VGH, and VGL), necessary for signal supply of the touch power circuit TPIC, to the touch power circuit TPIC.

The power management circuit PMIC may supply a variety of DC voltages (e.g., AVDD and AVSS), necessary for data driving of the data driver circuit DDC, to the data driver circuit DDC.

The touch controller TCTR may supply a pulse-width modulated (PWM) signal, necessary for output or generation of a variety of signals (e.g., TDS), to one or more circuits, such as the touch power circuit TPIC, the touch driver circuit TDC, or the data driver circuit DDC. The touch controller TCTR may be implemented, for example, as a microcontroller (MCU), a processor, etc.

In addition, the touch display device according to exemplary embodiments may further include one or more level shifters L/S to change the voltage levels of a variety of signals.

Each of the one or more level shifters L/S may be provided separately form the data driver circuit DDC, the gate driver circuit GDC, the touch driver circuit TDC, the touch power circuit TPIC, the power management circuit PMIC, the display controller DCTR, the touch controller TCTR, etc., or may be included as an internal module in one or more of the data driver circuit DDC, the gate driver circuit GDC, the touch driver circuit TDC, the touch power circuit TPIC, the power management circuit PMIC, the display controller DCTR, the touch controller TCTR, etc.

Referring to FIG. 10, the data driver circuit DDC may include a gamma block GMA necessary for converting digital image signals, input from the display controller DCTR or the like, into analog image signals.

Referring to FIG. 10, the touch power circuit TPIC may be configured to supply D/A conversion control signals, necessary for converting digital image signals into analog image signals, to the gamma block GMA in the data driver circuit DDC.

The above-stated D/A conversion control signals may include, for example, a gamma reference voltage EGBI_M. In some cases, the D/A conversion control signals may further include a half driving voltage HVDD_M having an intermediate level between the driving voltage AVDD, i.e., a high-level voltage, and the base voltage AVSS, i.e., a low-level voltage, and the like.

The gamma reference voltage EGBI_M, which may be one of the D/A conversion control signals, may include, for example, a high gamma reference voltage and a low gamma reference voltage input to both ends of a resistor string in the gamma block GMA.

The half driving voltage HVDD_M, which may be the other of the D/A conversion control signals, may be a voltage having a level substantially half that of the driving voltage AVDD.

As described above, the touch driver circuit TDC may output the first touch electrode driving signal TDS1, swinging with the first amplitude AMP1, to the plurality of touch electrodes TE, output the second touch electrode driving signal TDS2, corresponding to a DC voltage, to the plurality of touch electrodes TE, or output the third touch electrode driving signal TDS3, swinging with the third amplitude AMP3, to the entirety or a portion of the plurality of touch electrodes TE.

Here, the first touch electrode driving signal TDS1 is a driving signal for the touch sensing, and corresponds to the common voltage Vcom for the display processing. The second touch electrode driving signal TDS2 corresponds to the common voltage Vcom for the display processing. The third touch electrode driving signal TDS3 corresponds to a driving signal for the touch sensing.

In Case 1 in which both the touch driving and the display driving are performed, in a case in which the first touch electrode driving signal TDS1 is output to the plurality of touch electrodes TE, the load free driving is required to prevent unnecessary parasitic capacitance from being generated between the plurality of touch electrodes TE and the plurality of data lines DL.

In this regard, the data driver circuit DDC may supply a data signal Vdata to the data lines DL to cause the same voltage changes in the data lines DL as those caused by the first touch electrode driving signal TDS1 in the touch electrodes TE.

For such load free driving, the data driver circuit DDC may use gamma modulation.

More specifically, the data driver circuit DDC according to exemplary embodiments may convert a digital image signal into an analog image signal and output the data signal Vdata, corresponding to the converted analog image signal, to the data lines DL, in response to the gamma reference voltage EGBI_M in the form of a modulated signal swinging with a predetermined amplitude.

The data driver circuit DDC according to exemplary embodiments may include, for example, a digital-to-analog converter (DAC) converting a digital image signal into an analog image signal and an output buffer circuit outputting the data signal Vdata, corresponding to the converted analog image signal, to the data lines DL, in response to the gamma reference voltage EGBI_M in the form of a modulated signal swinging with a predetermined amplitude.

The gamma reference voltage EGBI_M, in the form of a modulated signal, may be a modulated signal synchronized with the first touch electrode driving signal TDS1 swinging with the first amplitude AMP1 and applied to the touch electrodes TE.

The frequency and phase of the gamma reference voltage EGBI_M in the form of a modulated signal may correspond to the frequency and phase of the first touch electrode driving signal TDS1. In some cases, the amplitude of the gamma reference voltage EGBI_M may be the same as or similar to the first amplitude AMP1 of the first touch electrode driving signal TDS1.

The data signal Vdata, generated on the basis of the gamma reference voltage EGBI_M in the form of a modulated signal, may include a voltage changing portion corresponding to the voltage change in the first touch electrode driving signal TDS1.

For the gamma modulation of the above-described data driver circuit DDC, in the driving timing corresponding to Case 1, the touch power circuit TPIC may output the gamma reference voltage EGBI_M, the amplitude of which corresponds to the first amplitude AMP1 of the first touch electrode driving signal TDS1, to the data driver circuit DDC.

In the driving timing corresponding to Case 2, the touch power circuit TPIC may output the gamma reference voltage EGBI_M, corresponding to a DC voltage, to the data driver circuit DDC.

In addition, in the driving timing corresponding to Case 3, the touch power circuit TPIC does not supply the gamma reference voltage EGBI_M having any form to the data driver circuit DDC.

Referring to FIG. 10, in the touch display device according to exemplary embodiments, the display panel DISP, the data driver circuit DDC, the gate driver circuit GDC, the touch driver circuit TDC, etc., may be grounded to a DC ground voltage GND.

Figure 11:
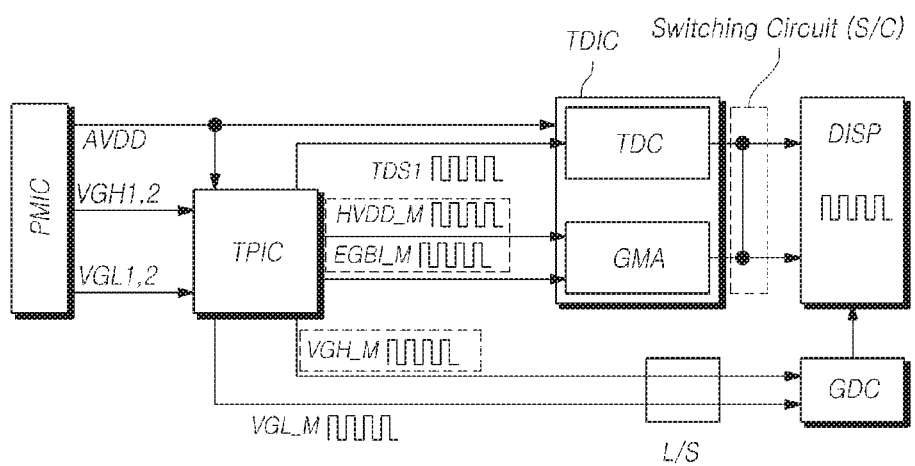
FIG. 11 illustrates a signal transmission system among components in Case 1 of the time free driving in the touch display device according to exemplary embodiments.
Figure 12:
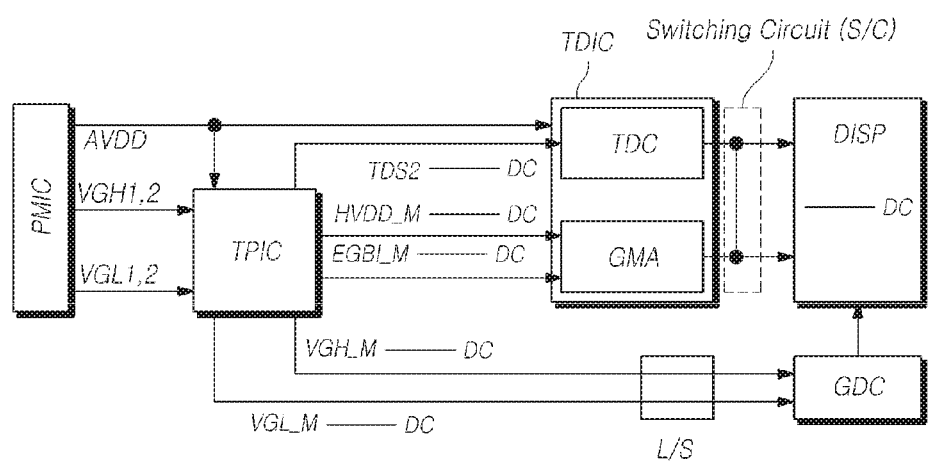
FIG. 12 illustrates a signal transmission system among components in Case 2 of the time free driving in the touch display device according to exemplary embodiments.
Figure 13:
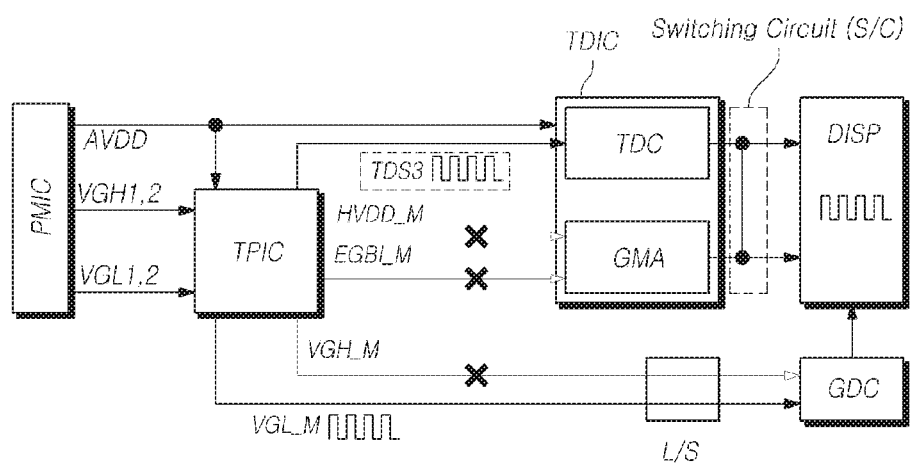
FIG. 13 illustrates a signal transmission system among components in Case 3 of the time free driving in the touch display device according to exemplary embodiments.

FIGS. 11 to 13 illustrate signal transmission systems among components in the three cases of the time free driving in the touch display device according to exemplary embodiments. Here, the touch driving function of the touch driver circuit TDC and the data driving function of the data driver circuit DDC will be described as being integrated into an integrated driver circuit TDIC. In addition, the integrated driver circuit TDIC may be provided as one or more circuits.

Referring to FIGS. 11 to 13, the touch power circuit TPIC receives a DC driving voltage AVDD, on-level gate voltages VGH1 and VGH2, and off-level gate voltages VGL1 and VGL2 from the power management circuit PMIC.

Referring to FIG. 11, in a case in which the display driving and the touch driving are simultaneously performed (Case 1), the touch power circuit TPIC may supply the first touch electrode driving signal TDS1 having the first amplitude AMP1 to the touch driver circuit TDC.

The touch power circuit TPIC may supply the half driving voltage HVDD_M, swinging in synchronization with the first touch electrode driving signal TDS1, and the gamma reference voltage EGBI_M to the gamma block GMA of the data driver circuit DDC. Here, the frequency and phase of each of the half driving voltage HVDD_M and the gamma reference voltage EGBI_M may correspond to the frequency and phase of the first touch electrode driving signal TDS1.

The touch power circuit TPIC may supply the on-level gate voltage VGH_M, swinging in synchronization with the first touch electrode driving signal TDS1, and the off-level gate voltage VGL_M to the gate driver circuit GDC. Here, the frequency and phase of each of the on-level gate voltage VGH_M and the off-level gate voltage VGL_M may correspond to the frequency and phase of the first touch electrode driving signal TDS1.

The touch power circuit TPIC may supply the on-level gate voltage VGH_M and the off-level gate voltage VGL_M to the gate driver circuit GDC by changing the voltage levels of the on-level gate voltage VGH_M and the off-level gate voltage VGL_M through the level shifter L/S. The level shifter L/S may be present within the gate driver circuit GDC.

The touch driver circuit TDC may output the first touch electrode driving signal TDS1 having the first amplitude AMP1 to the plurality of touch electrodes TE.

Here, the first touch electrode driving signal TDS1 may be not only a driving signal for the touch sensing, but also the common voltage Vcom for the display processing.

The data driver circuit DDC may convert a digital image signal into an analog image signal and output the data signal Vdata, corresponding to the converted analog image signal, to the data lines DL, in response to the gamma reference voltage EGBI_M, the frequency and phase of which correspond to those of the first touch electrode driving signal TDS1.

In a case in which the first touch electrode driving signal TDS1 is output to the plurality of touch electrodes TE, the gate driver circuit GDC may supply the first off-level gate voltage VGL_M, the frequency and phase of which correspond to those of the first touch electrode driving signal TDS1, to the gate lines GL or the first on-level gate voltage VGH_M, offset by the same value as the first off-level gate voltage VGL_M, to the gate lines GL.

In Case 1, the display panel 110 may have a voltage-swinging characteristic.

Referring to FIG. 12, in a case in which only the display driving is performed during the active period (Case 2), the touch power circuit TPIC may supply the second touch electrode driving signal TDS2, corresponding to a DC voltage, to the touch driver circuit TDC.

The touch power circuit TPIC may supply the half driving voltage HVDD_M, in the form of a DC voltage, and the gamma reference voltage EGBI_M, in the form of a DC voltage, to the gamma block GMA of the data driver circuit DDC.

The touch power circuit TPIC may supply the on-level gate voltage VGH_M and the off-level gate voltage VGL_M, in the form of a DC voltage, to the gate driver circuit GDC.

The touch power circuit TPIC may supply the on-level gate voltage VGH_M and the off-level gate voltage VGL_M, in the form of a DC voltage, to the gate driver circuit GDC by changing the voltage levels of the on-level gate voltage VGH_M and the off-level gate voltage VGL_M through the level shifter L/S.

The touch driver circuit TDC may supply the second touch electrode driving signal TDS2, in the form of a DC voltage, to the plurality of touch electrodes TE.

Here, the second touch electrode driving signal TDS2, in the form of a DC voltage, supplied to the plurality of touch electrodes TE, may be a common voltage for the display driving. Accordingly, the plurality of touch electrodes TE may be common electrodes.

The data driver circuit DDC may convert a digital image signal into an analog image signal and output the data signal Vdata, corresponding to the converted analog image signal, to the data lines DL, in response to the gamma reference voltage EGBI_M and the half driving voltage HVDD_M respectively corresponding to a DC voltage.

In a case in which the second touch electrode driving signal TDS2 is output to the plurality of touch electrodes TE, the gate driver circuit GDC may supply the second off-level gate voltage VGL_M, in the form of a DC voltage, to the gate lines GL, or the second on-level gate voltage VGH_M, in the form of a DC voltage, to the gate lines GL.

In Case 2, the display panel 110 may have a DC voltage characteristic.

Referring to FIG. 13, in a case in which the touch driving is simultaneously performed during a blank period (Case 3), the touch power circuit TPIC may supply the third touch electrode driving signal TDS3 having the third amplitude AMP3 to the touch driver circuit TDC.

Since the display driving is not necessary during the blank period, the touch power circuit TPIC does not supply either the half driving voltage HVDD_M or the gamma reference voltage EGBI_M to the gamma block GMA of the data driver circuit DDC. That is, during the blank period, according to Case 3 of the time free driving, the gamma reference voltage EGBI_M is not input to the data driver circuit DDC, since the display driving is not performed although the touch driving is performed.

The touch power circuit TPIC may supply the off-level gate voltage VGL_M, swinging in synchronization with the third touch electrode driving signal TDS3, to the gate driver circuit GDC. Here, the frequency and phase of the off-level gate voltage VGL_M may correspond to the frequency and phase of the third touch electrode driving signal TDS3.

Since the display driving is not necessary during the blank period, the touch power circuit TPIC does not output the on-level gate voltage VGH_M swinging in synchronization with the third touch electrode driving signal TDS3.

The touch power circuit TPIC may supply the off-level gate voltage VGL_M to the gate driver circuit GDC by changing the voltage level of the off-level gate voltage VGL_M through the level shifter L/S. The level shifter L/S may be present within the gate driver circuit GDC.

During the blank period, the touch driver circuit TDC may output the third touch electrode driving signal TDS3, having the third amplitude AMP3 different from the first amplitude AMP1, to the entirety or a portion of the plurality of touch electrodes TE.

Here, the third touch electrode driving signal TDS3 is not a common voltage for the display processing but is a driving signal for the touch sensing.

The third touch electrode driving signal TDS3, output from the touch driver circuit TDC, may be applied not only to the entirety or a portion of the plurality of touch electrodes TE, but also to other electrodes (e.g., other touch electrodes) or other lines (e.g., DL and GL), disposed in the display panel DISP, via a switching circuit S/C for the load free driving.

More specifically, during the blank period, the third touch electrode driving signal TDS3 or a signal corresponding to the third touch electrode driving signal TDS3 may be applied to the entirety or a portion of the plurality of data lines DL. Here, the third touch electrode driving signal TDS3 or the signal corresponding to the third touch electrode driving signal TDS3, applied to the entirety of a portion of the plurality of data lines DL, is load free driving signal that can prevent parasitic capacitance from being generated between the corresponding touch electrodes TE and the corresponding data lines DL, thereby removing load (or RC delay) between the corresponding touch electrodes TE and the corresponding touch lines TL.

In a case in which the third touch electrode driving signal TDS3 is output to the plurality of touch electrodes TE, the gate driver circuit GDC may supply the third off-level gate voltage VGL_M, the frequency and phase of which correspond to the frequency and phase of the third touch electrode driving signal TDS3, to the gate lines GL.

During the blank period, the third touch electrode driving signal TDS3 or a signal (e.g., the third off-level voltage gate voltage) corresponding to the third touch electrode driving signal TDS3 may be applied to the entirety or a portion of the plurality of gate lines GL.

Here, the third touch electrode driving signal TDS3 or the signal corresponding to the third touch electrode driving signal TDS3, applied to the entirety of a portion of the plurality of gate lines GL, is a load free driving signal that can prevent parasitic capacitance from being generated between the corresponding touch electrodes TE and the corresponding gate lines GL, thereby removing a load (or RC delay) between the corresponding touch electrodes TE and the corresponding data lines DL.

In Case 3, the display panel 110 may have a voltage-swinging characteristic.

Hereinafter, among the three cases of the time free driving (Case 1, Case 2, and Case 3), Case 1, in which the display driving and the touch driving are simultaneously performed, will be described in more detail.

Figure 14:
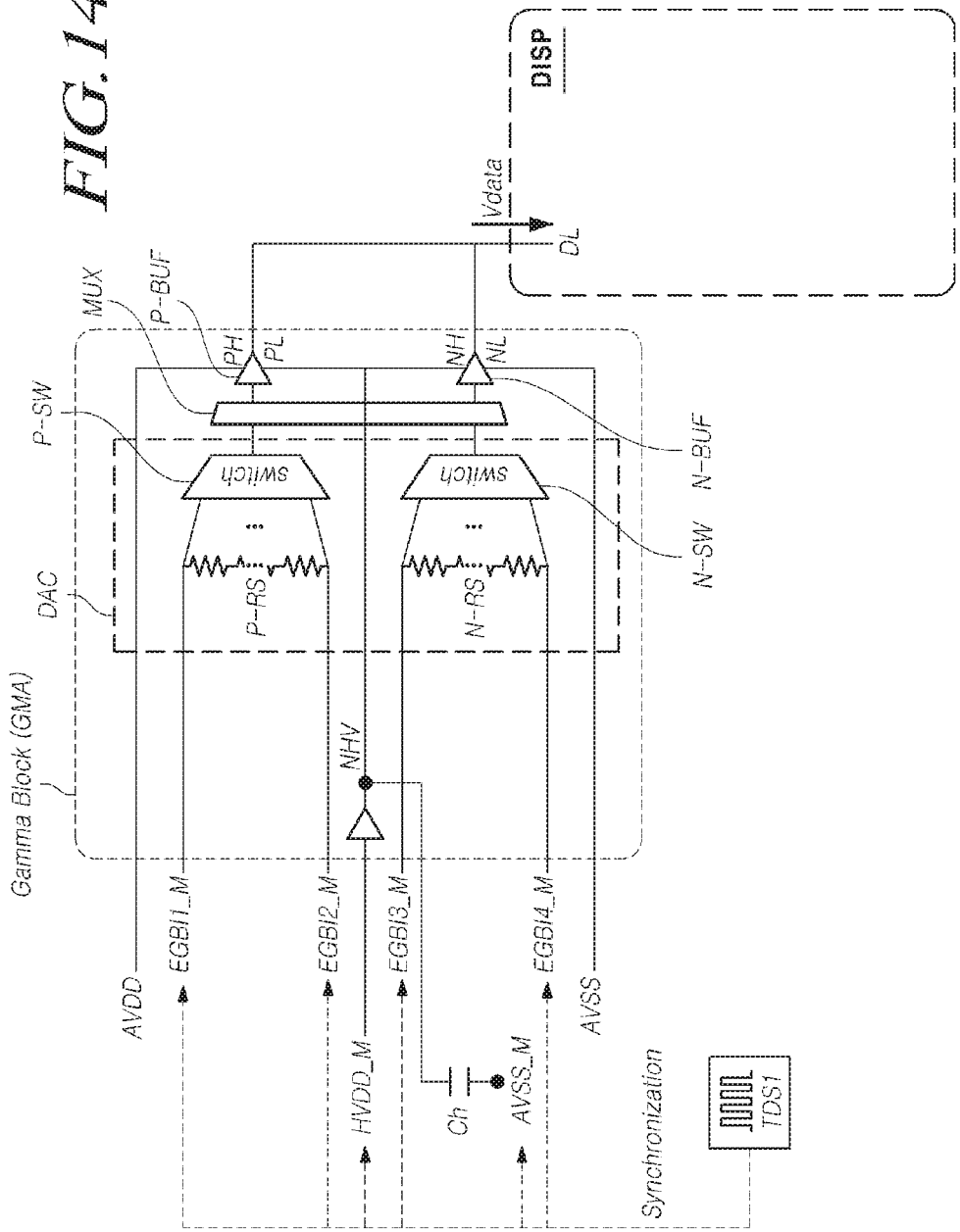
FIG. 14 illustrates a gamma block performing the time free driving on the data lines by the gamma modulation in the time free driving system of the touch display device according to exemplary embodiments.
Figure 15:
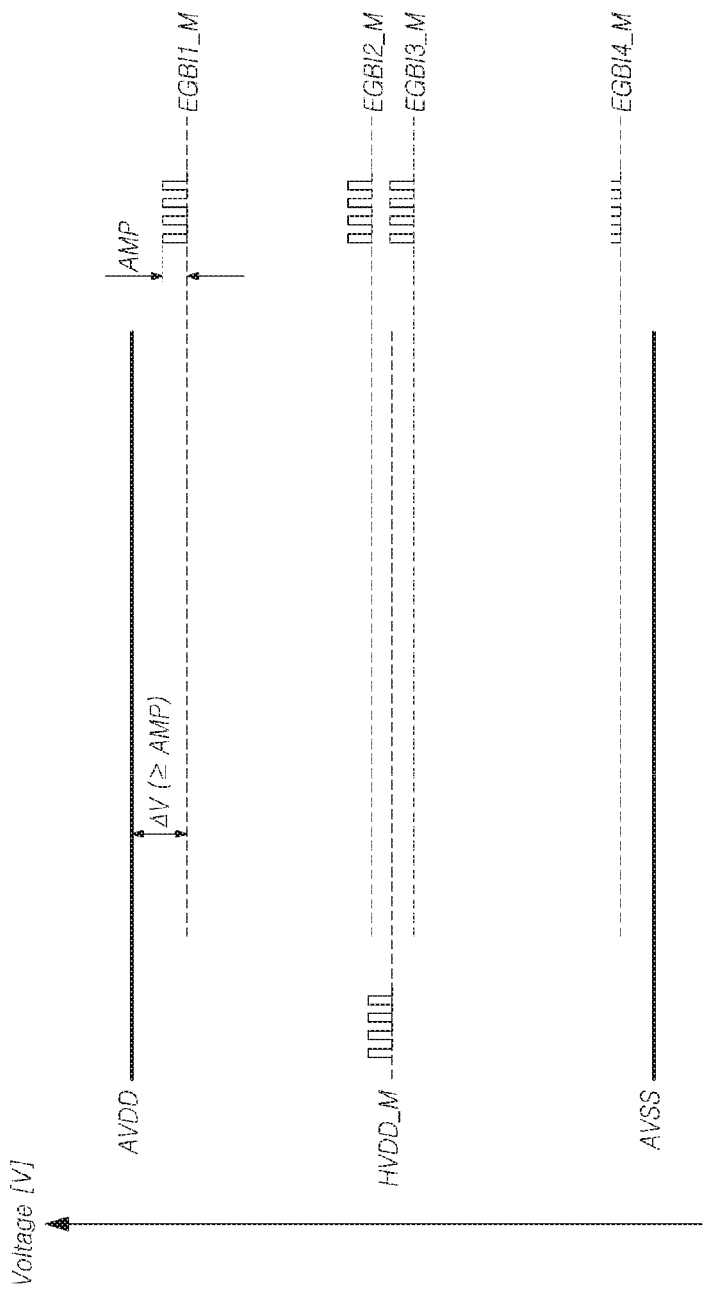
FIG. 15 illustrates voltage levels and characteristics of gamma reference voltages used in the gamma block to perform the time free driving on the data lines DL by the gamma modulation in the system of the touch display device according to exemplary embodiments.

FIG. 14 illustrates the gamma block GMA performing the time free driving on the data lines DL by the gamma modulation in the time free driving (TFD) system of the touch display device according to exemplary embodiments, and FIG. 15 illustrates voltage levels and characteristics of gamma reference voltages EGBI1_M, EGBI2_M, EGBI3_M, and EGBI4_M used in the gamma block GMA to perform the time free driving on the data lines DL by the gamma modulation in the TFD system of the touch display device according to exemplary embodiments.

Hereinafter, the data lines DL will be described as being driven by polarity inversion driving.

The gamma block GMA in the data driver circuit DDC according to exemplary embodiments may include a digital-to-analog converter DAC converting a digital image signal to an analog image signal having a positive polarity or a negative polarity using the gamma reference voltages EGBI1_M, EGBI2_M, EGBI3_M, and EGBI4_M.

The digital-to-analog converter DAC may include a first converter (or positive converter) and a second converter (or negative converter).

The first converter of the digital-to-analog converter DAC includes a first resistor string P-RS comprised of a plurality of resistors connected in series, a first switch P-SW selecting an analog image voltage having a positive polarity depending on the digital image signal, etc. The second converter of the digital-to-analog converter DAC includes a second resistor string N-RS comprised of a plurality of resistors connected in series, a second switch N-SW selecting an analog image voltage having a negative polarity depending on the digital image signal, etc.

The gamma block GMA in the data driver circuit DDC according to exemplary embodiments may include a multiplexer MUX selecting the analog image voltage having a positive polarity and the analog image voltage having a negative polarity, a first output buffer circuit P-BUF outputting a first data signal Vdata, corresponding to the analog image voltage having positive polarity, to the data lines DL, a second output buffer circuit N-BUF outputting a second data signal Vdata, corresponding to the analog image voltage having negative polarity, to the data lines DL, etc.

Referring to FIGS. 14 and 15, in a case in which the data driver circuit DDC performs polarity conversion driving, the gamma reference voltage EGBI_M in the form of a modulated signal may include the first gamma reference voltage EGBI1_M and the second gamma reference voltage EGBI2_M, applied to both ends of the resistor string P-RS having positive polarity, and the third gamma reference voltage EGBI3_M and the fourth gamma reference voltage EGBI4_M applied to both ends of the resistor string N-RS having negative polarity.

Each of the four gamma reference voltages EGBI1_M, EGBI2_M, EGBI3_M, and EGBI4_M may be a modulated signal, the frequency and phase of which is synchronized with the frequency and phase of the first touch electrode driving signal TDS1.

Each of the four gamma reference voltages EGBI1_M, EGBI2_M, EGBI3_M, and EGBI4_M may be a variable voltage, the amplitude of which is the same as or similar to the first amplitude AMP1 of the first touch electrode driving signal TDS1.

In other words, in the data driver circuit DDC, the digital-to-analog converter DAC may receive a digital image signal, receive the first gamma reference voltage EGBI1_M, the second gamma reference voltage EGBI2_M, the third gamma reference voltage EGBI3_M, and the fourth gamma reference voltage EGBI4_M, the phase and frequency of which correspond to the phase and frequency of the first touch electrode driving signal TDS1, and convert the digital image signal into a first analog image signal (i.e., an analog image signal having positive polarity), in response to the first gamma reference voltage EGBI1_M and the second gamma reference voltage EGBI2_M, or convert the digital image signal into a second analog image signal (i.e., an analog image signal having negative polarity), in response to the third gamma reference voltage EGBI3_M and the fourth gamma reference voltage EGBI4_M.

The first output buffer circuit P-BUF may receive the first analog image signal and output the first data signal Vdata to the data lines DL.

The second output buffer circuit N-BUF may receive the second analog image signal and output the second data signal Vdata to the data lines DL.

The first data signal Vdata may be a data signal Vdata having positive polarity, output to the data lines DL in the ith frame, while the second data signal Vdata may be a data signal Vdata having negative polarity, output to the data lines DL in the (i+1)th frame.

Referring to FIGS. 14 and 15, the first gamma reference voltage EGBI1_M may be a positive high gamma reference voltage, the second gamma reference voltage EGBI2_M may be a positive low gamma reference voltage, the third gamma reference voltage EGBI3_M may be a negative high gamma reference voltage, and the fourth gamma reference voltage EGBI4_M may be a negative low gamma reference voltage.

Each of the first gamma reference voltage EGBI1_M, the second gamma reference voltage EGBI2_M, the third gamma reference voltage EGBI3_M, and the fourth gamma reference voltage EGBI4_M may be a modulated signal swinging in synchronization with the first touch electrode driving signal TDS1, with the frequency and phase thereof corresponding to the frequency and phase of the first touch electrode driving signal TDS1.

Each of the first gamma reference voltage EGBI1_M, the second gamma reference voltage EGBI2_M, the third gamma reference voltage EGBI3_M, and the fourth gamma reference voltage EGBI4_M may have an amplitude corresponding to the first amplitude AMP1 of the first touch electrode driving signal TDS1.

The first gamma reference voltage EGBI1_M may be set as a voltage higher than the second gamma reference voltage EGBI2_M. The second gamma reference voltage EGBI2_M may be set as a voltage higher than the third gamma reference voltage EGBI3_M. The third gamma reference voltage EGBI3_M may be set as a voltage higher than the fourth gamma reference voltage EGBI4_M.

In addition, referring to FIG. 14, the first output buffer circuit P-BUF may be activated by the driving voltage AVDD applied to a PH node and the half driving voltage HVDD_M applied to a PL node.

The second output buffer circuit N-BUF may be activated by the half driving voltage HVDD_M applied to an NH node and the base voltage AVSS applied to a NL node.

The driving voltage AVDD, applied to the first output buffer circuit P-BUF, and the half driving voltage HVDD_M, applied to the second output buffer circuit N-BUF, are voltages having the same function (i.e., buffer driving voltages). The half driving voltage HVDD_M, applied to the first output buffer circuit P-BUF, and the base voltage AVSS, applied to the second output buffer circuit N-BUF, are voltages having the same function (i.e., buffer base voltages).

The driving voltage AVDD may be a DC voltage. The base voltage AVSS may be a DC voltage lower than the driving voltage AVDD. For example, the base voltage AVSS may be 0V.

The half driving voltage HVDD_M may be a signal, the voltage of which swings between the driving voltage AVDD and the base voltage AVSS.

The half driving voltage HVDD_M may be a signal, the frequency and phase of which correspond to the frequency and phase of the first touch electrode driving signal TDS1. Thus, the frequency and phase of the half driving voltage HVDD_M may correspond to the frequency and phase of the first gamma reference voltage EGBI1_M, the second gamma reference voltage EGBI2_M, the third gamma reference voltage EGBI3_M, and the fourth gamma reference voltage EGBI4_M.

In some cases, the amplitude of the half driving voltage HVDD_M may correspond to the first amplitude AMP1 of the first touch electrode driving signal TDS1. Thus, the amplitude of the half driving voltage HVDD_M may correspond to the amplitude of the first gamma reference voltage EGBI1_M, the second gamma reference voltage EGBI2_M, the third gamma reference voltage EGBI3_M, and the fourth gamma reference voltage EGBI4_M.

Each of the first gamma reference voltage EGBI1_M and the second gamma reference voltage EGBI2_M may be set as a voltage higher than the half driving voltage HVDD_M. Each of the third gamma reference voltage EGBI3_M and the fourth gamma reference voltage EGBI4_M may be set as a voltage lower than the half driving voltage HVDD_M.

The low-level voltage of the fourth gamma reference voltage EGBI4_M may be set to be higher than the base voltage AVSS. In particular, a diffrence ΔV between the low-level voltage of the first gamma reference voltage EGBI1_M and the driving voltage AVDD may be set to be equal to or greater than the amplitude AMP of the first gamma reference voltage EGBI_M.

Referring to FIG. 14, a voltage AVSS_M, the amplitude of which corresponds to the first amplitude AMP1 of the first touch electrode driving signal TDS1, may be applied to an NHV node to which a point (i.e., PL node), at which the half driving voltage HVDD_M is applied to the first output buffer circuit P-BUF, and a point (i.e., NH node), at which the half driving voltage HVDD_M is applied to the second output buffer circuit N-BUF, are commonly connected.

The half driving voltage HVDD_M serves as a low-level base voltage for the first output buffer circuit P-BUF while serving as a high-level driving voltage for the second output buffer circuit N-BUF. In this regard, a capacitor Ch connected to the NHV node may contribute to the voltage stabilization of the NHV node and the half driving voltage HVDD_M.

Figure 16:
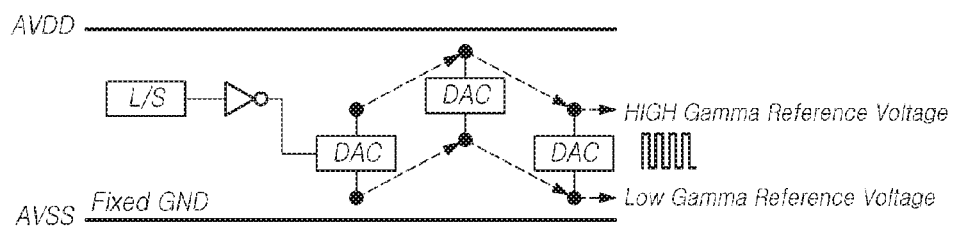
FIG. 16 illustrates digital-analog conversion characteristics in the gamma block for performing the time free driving on the data lines DL by the gamma modulation in the touch display device according to exemplary embodiments.

FIG. 16 illustrates digital-analog conversion characteristics in the gamma block GMA for performing the time free driving on the data lines DL by the gamma modulation in the touch display device according to exemplary embodiments.

Referring to FIG. 16, the digital-to-analog converter DAC alternately operates the first converter (i.e., positive converter) and the second converter (i.e., negative converter).

In the case of digital-analog conversion in the first converter (i.e., positive converter), the high gamma reference voltage is the first gamma reference voltage EGBI1_M, while the low gamma reference voltage is the second gamma reference voltage EGBI2_M.

In the case of digital-analog conversion in the second converter (i.e., negative converter), the high gamma reference voltage is the third gamma reference voltage EGBI3_M, while the low gamma reference voltage is the fourth gamma reference voltage EGBI4_M.

The analog image signal, output from the digital-to-analog converter DAC, may swing between the driving voltage AVDD and the base voltage AVSS. Here, the base voltage AVSS may be a fixed ground voltage GND.

An analog image signal output from the digital-to-analog converter DAC may have not only a significant voltage change due to positive inversion driving, but also an insignificant voltage change due to the change in the low gamma reference voltage itself.

Figure 17:
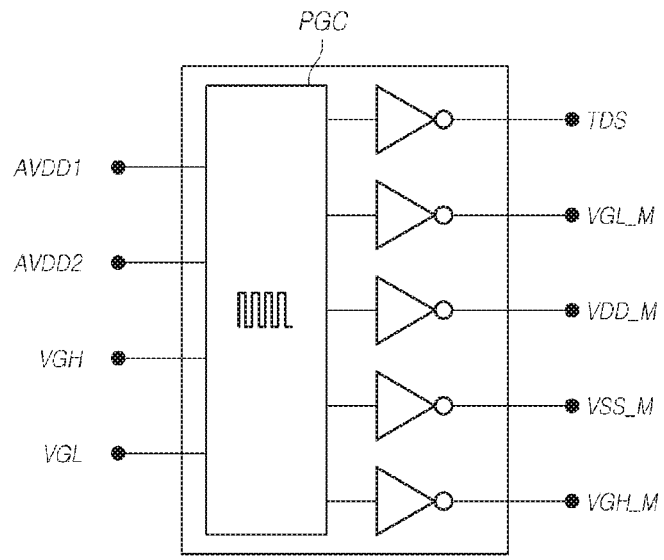
FIG. 17 illustrates a load free driving block in the time free driving system of the touch display device according to exemplary embodiments.
Figure 18:
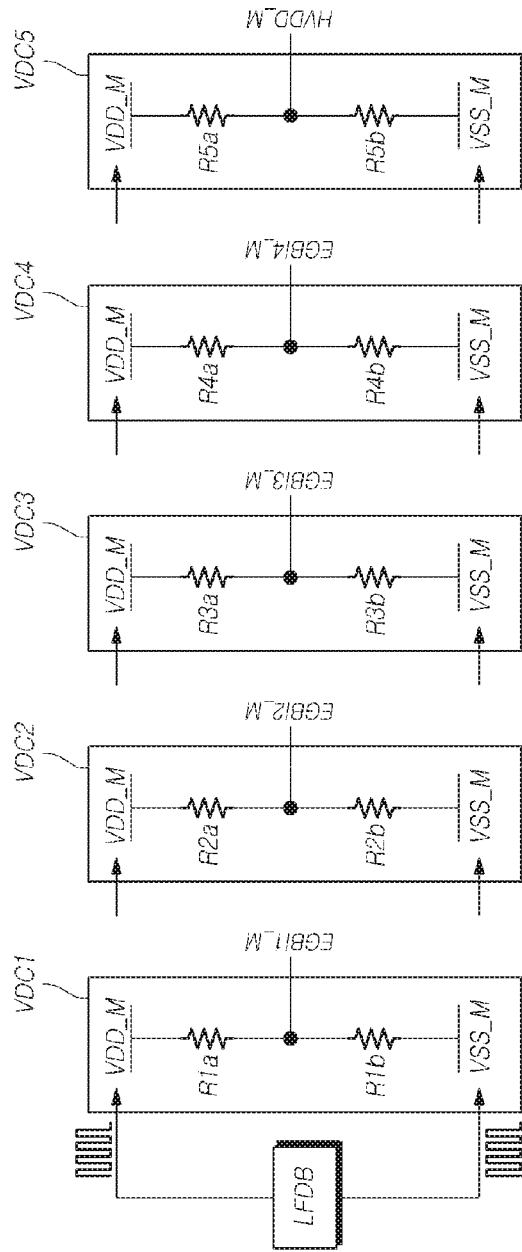
FIG. 18 illustrates a circuit generating a variety of voltages for the gamma modulation in the time free driving system of the touch display device according to exemplary embodiments.

FIG. 17 illustrates a load free driving block LFDB in the time free driving system of the touch display device according to exemplary embodiments, while FIG. 18 illustrates a circuit generating a variety of voltages EGBI1_M, EGBI2_M, EGBI3_M, EGBI4_M, and HVDD_M for the gamma modulation in the time free driving system of the touch display device according to exemplary embodiments.

Referring to FIG. 17, a printed circuit board (PCB) or the like, on which the touch power circuit TPIC and the microcontroller MCU are mounted, may include a load free driving block LFDB.

The load free driving block LFDB receives four or more DC voltages AVDD1, AVDD2, VGH, and VGL. A pulse generator circuit PGC in the load free driving block LFDB generates modulated signals TDS, VGL_M, VGH_M, VDD_M, and VSS_M, necessary for the time free driving and the load free driving, using the four or more voltages AVDD1, AVDD2, VGH, and VGL input to the load free driving block LFDB.

Each of the modulated signals TDS, VGL_M, VGH_M, VDD_M, and VSS_M, generated by the pulse generator circuit PGC in the load free driving block LFDB, may be a signal having a variable voltage, may be a signal swinging with a predetermined amplitude, and may be referred to as a pulse signal or an alternating current (AC) signal.

Here, in a case in which the touch electrode driving signal TDS, applied to the touch electrodes TE, is the first touch electrode driving signal TDS1 or the third touch electrode driving signal TDS3, the pulse generator circuit PGC may set a voltage AVDD1 as a low-level voltage and a voltage AVDD2 as a high-level voltage, thereby generating the first touch electrode driving signal TDS1 or the third touch electrode driving signal TDS3 in the form of a modulated signal swinging between the voltage AVDD1 and the voltage AVDD2.

Referring to FIG. 18, the load free driving block LFDB applies a modulated driving voltage VDD_M and a modulated base voltage VSS_M, among the generated modulated signals TDS, VGL_M, VGH_M, VDD_M, and VSS_M, to both ends of the first to fifth voltage distribution circuits VDC1, VDC2, VDC3, VDC4, and VDC5.

The first voltage distribution circuit VDC1 includes a resistor R1*a* and a resistor R1*b* connected between the modulated driving voltage VDD_M and the modulated base voltage VSS_M in series, and outputs the first gamma reference voltage EGBI1_M through a connection point between the two resistors R1*a* and R1*b*.

Here, the first gamma reference voltage EGBI1_M may be a modulated signal having a variable voltage like the modulated driving voltage VDD_M and the modulated base voltage VSS_M. The level of the first gamma reference voltage EGBI1_M may vary depending on the magnitudes of the resistors R1*a* and R1*b*.

The second voltage distribution circuit VDC2 includes a resistor R2*a* and a resistor R2*b* connected between the modulated driving voltage VDD_M and the modulated base voltage VSS_M in series, and outputs the second gamma reference voltage EGBI2_M through a connection point between the two resistors R2*a* and R2*b*.

Here, the second gamma reference voltage EGBI2_M may be a modulated signal having a variable voltage like the modulated driving voltage VDD_M and the modulated base voltage VSS_M. The level of the second gamma reference voltage EGBI2_M may vary depending on the magnitudes of the resistors R2*a* and R2*b*.

The third voltage distribution circuit VDC3 includes a resistor R3*a* and a resistor R3*b* connected between the modulated driving voltage VDD_M and the modulated base voltage VSS_M in series, and outputs the third gamma reference voltage EGBI3_M through a connection point between the two resistors R3*a* and R3*b*.

Here, the third gamma reference voltage EGBI3_M may be a modulated signal having a variable voltage like the modulated driving voltage VDD_M and the modulated base voltage VSS_M. The level of the third gamma reference voltage EGBI3_M may vary depending on the magnitudes of the resistors R3*a* and R3*b*.

The fourth voltage distribution circuit VDC4 includes a resistor R4*a* and a resistor R4*b* connected between the modulated driving voltage VDD_M and the modulated base voltage VSS_M in series, and outputs the fourth gamma reference voltage EGBI4_M through a connection point between the two resistors R4*a* and R4*b*.

Here, the fourth gamma reference voltage EGBI4_M may be a modulated signal having a variable voltage like the modulated driving voltage VDD_M and the modulated base voltage VSS_M. The level of the fourth gamma reference voltage EGBI4_M may vary depending on the magnitudes of the resistors R4a and R4b.

The first to fifth voltage distribution circuits VDC1, VDC2, VDC3, VDC4, and VDC5 may be included within the touch power circuit TPIC, or may be mounted on a PCB, on which the touch power circuit TPIC may be mounted.

Figure 19:
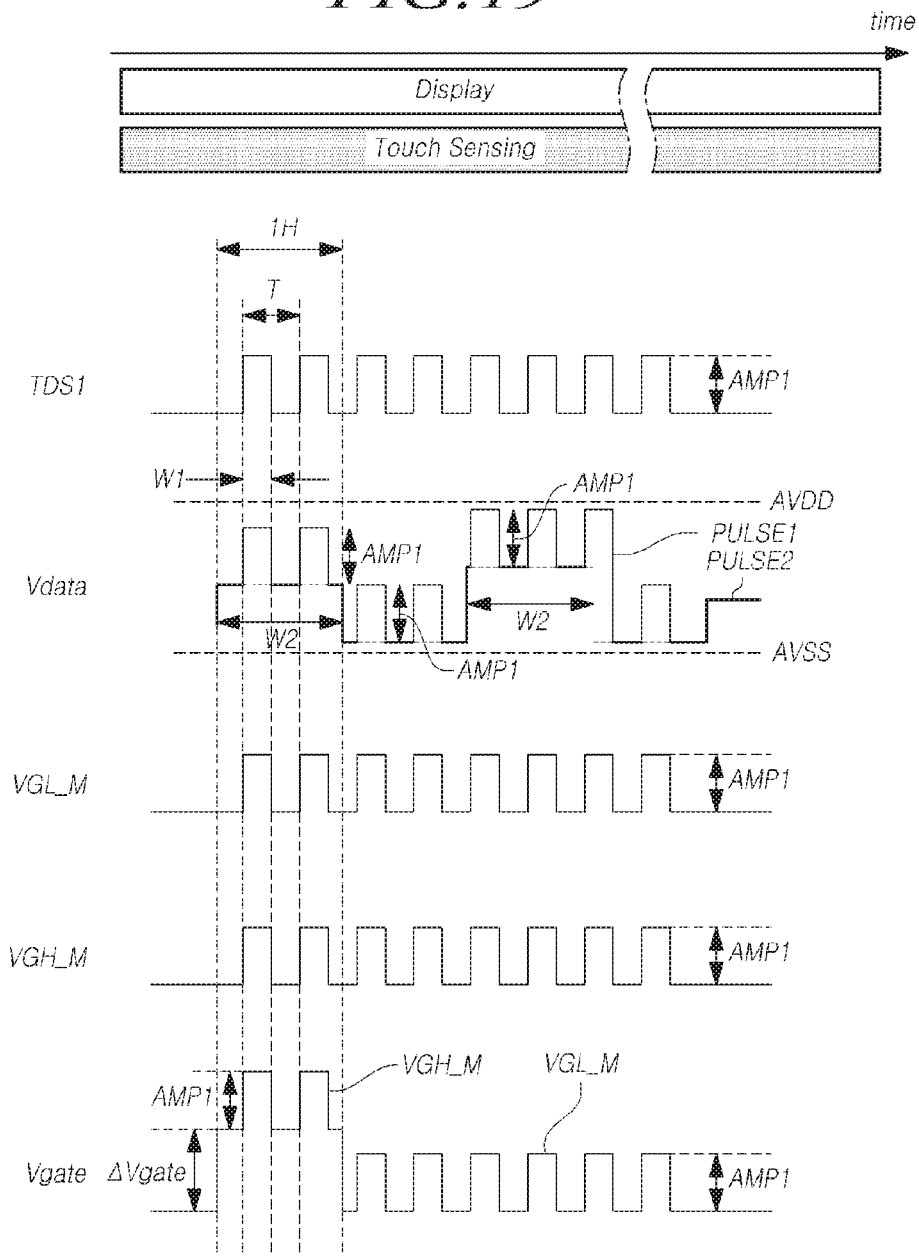
FIG. 19 illustrates signal waveforms of major signals for the time-free driving in a time-free driving system of the touch display device according to exemplary embodiments, in a case in which the first touch electrode driving signal has a high frequency.
Figure 20:
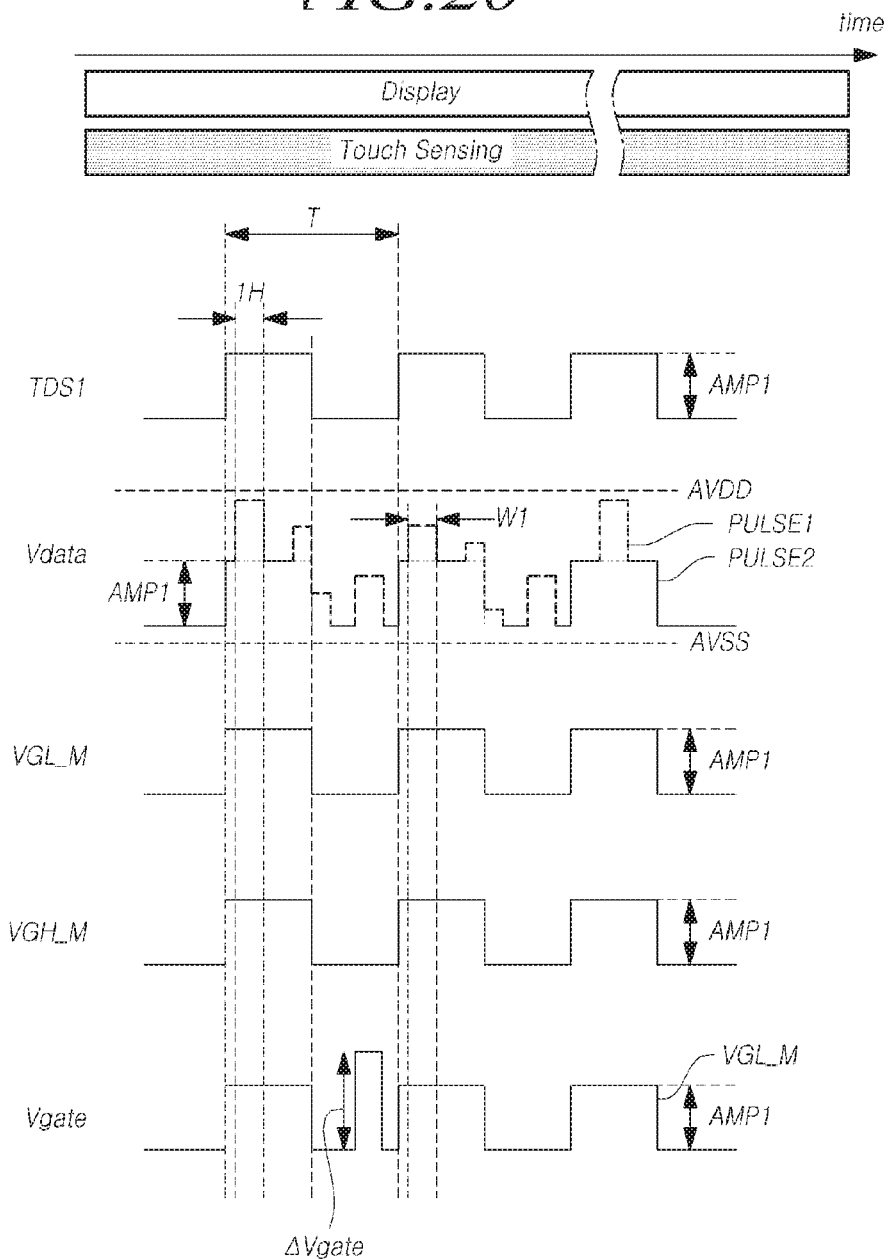
FIG. 20 illustrates signal waveforms of major signals for the time-free driving in the time-free driving system of the touch display device according to exemplary embodiments, in a case in which the first touch electrode driving signal has a low frequency.

FIG. 19 illustrates signal waveforms of major signals TDS1, Vdata, VGL_M, VGH_M, and Vgate for the time-free driving in a time-free driving (TFD) system of the touch display device according to exemplary embodiments, in a case in which the first touch electrode driving signal TDS1 has a high frequency, and FIG. 20 illustrates signal waveforms of major signals TDS1, Vdata, VGL_M, VGH_M, and Vgate for the time-free driving in the time-free driving system of the touch display device according to exemplary embodiments, in a case in which the first touch electrode driving signal TDS1 has a low frequency.

The frequency of the first touch electrode driving signal TDS1 may be set to be high or low. That is, the period T of the first touch electrode driving signal TDS1 may be short or long.

As illustrated in FIG. 19, the period T of the first touch electrode driving signal TDS1 may be shorter than a predetermined horizontal period. As illustrated in FIG. 12, the period T of the first touch electrode driving signal TDS1 may be longer than the predetermined horizontal period.

Here, the predetermined horizontal period may be 1H, 2H, 3H, etc. Hereinafter, the predetermined horizontal period will be described as being 1H by way of example.

Referring to FIGS. 19 and 20, in a case in which the display driving and the touch driving are simultaneously performed according to the time-free driving method, the data signal Vdata may be a combined signal comprised of first pulses PULSE1 having a first pulse width W1 and second pulses PULSE2 having a second pulse width W2. Here, the second pulse width W2 may be wider than the first pulse width W1.

Referring to FIGS. 19 and 20, the voltage of the data signal Vdata may change between the driving voltage AVDD and the base voltage AVSS.

As illustrated in FIG. 19, in a case in which the period T of the first touch electrode driving signal TDS1 is shorter than the predetermined horizontal period (e.g., 1H), the first pulses PULSE1 of the data signal Vdata may have a portion, the amplitude of which corresponds to the first amplitude AMP1 of the first touch electrode driving signal TDS1. The first pulse width W1 of the first pulses PULSE1 may correspond to the pulse width of the first touch electrode driving signal TDS1.

As illustrated in FIG. 20, in a case in which the period T of the first touch electrode driving signal TDS1 is longer than the predetermined horizontal period (e.g., 1H), the second pulses PULSE2 of the data signal Vdata may have a portion, the amplitude of which corresponds to the first amplitude AMP1 of the first touch electrode driving signal TDS1. The second pulse width W2 of the second pulses PULSE2 may correspond to the pulse width of the first touch electrode driving signal TDS1.

Referring to FIGS. 19 and 20, the frequency and phase of the off-level gate voltage VGL_M, supplied from a touch power circuit TPIC to the gate driver circuit GDC, correspond to the frequency and phase of the first touch electrode driving signal TDS1. The frequency and phase of the on-level gate voltage VGH_M, supplied from the touch power circuit TPIC to the gate driver circuit GDC, correspond to the frequency and phase of the first touch electrode driving signal TDS1.

Referring to FIGS. 19 and 20, the off-level gate voltage VGL_M and the on-level gate voltage VGH_M may have the same amplitude as the first amplitude AMP1 of the first touch electrode driving signal TDS1 or the same amplitude within an tolerance range.

Referring to FIG. 19, the scan signal Vgate applied to a gate line GL may have the off-level gate voltage VGL_M during the remaining period other than the horizontal period 1H in which the corresponding gate line GL is opened, and the on-level gate voltage VGH_M may be output during the horizontal period 1H in which the corresponding gate line GL is opened. The scan signal Vgate may be a signal in which a voltage ΔVgate corresponding to an amplitude necessary for opening the corresponding gate line GL is added to the on-level gate voltage VGH_M. The voltage ΔVgate corresponding to the amplitude for opening the corresponding gate line GL may be a voltage difference between a high-level gate voltage VGH, in the form of a DC voltage, and a low-level gate voltage VGL.

Referring to FIG. 19, during the horizontal period 1H in which the corresponding gate line GL is opened, the scan signal Vgate applied to the gate line GL is a signal in which the off-level gate voltage VGL_M in the form of a modulated signal is carried on the on-level gate voltage VGH. During the remaining period other than the horizontal period 1H, the scan signal Vgate applied to the gate line GL is the off-level gate voltage VGL_M in the form of a modulated signal. Here, the frequency and phase of the off-level gate voltage VGL_M in the form of a modulated signal correspond to the frequency and phase of the first touch electrode driving signal TDS1.

Referring to FIG. 20, during the horizontal period 1H in which the corresponding gate line GL is opened, the scan signal Vgate applied to the gate line GL is a signal in which the voltage ΔVgate corresponding to an amplitude necessary for opening the corresponding gate line GL is carried on the off-level gate voltage VGL_M in the form of a modulated signal. During the remaining period other than the horizontal period 1H, the scan signal Vgate applied to the gate line GL is the off-level gate voltage VGL_M in the form of a modulated signal. Here, the frequency and phase of the off-level gate voltage VGL_M in the form of a modulated signal correspond to the frequency and phase of the first touch electrode driving signal TDS1.

Figure 21:
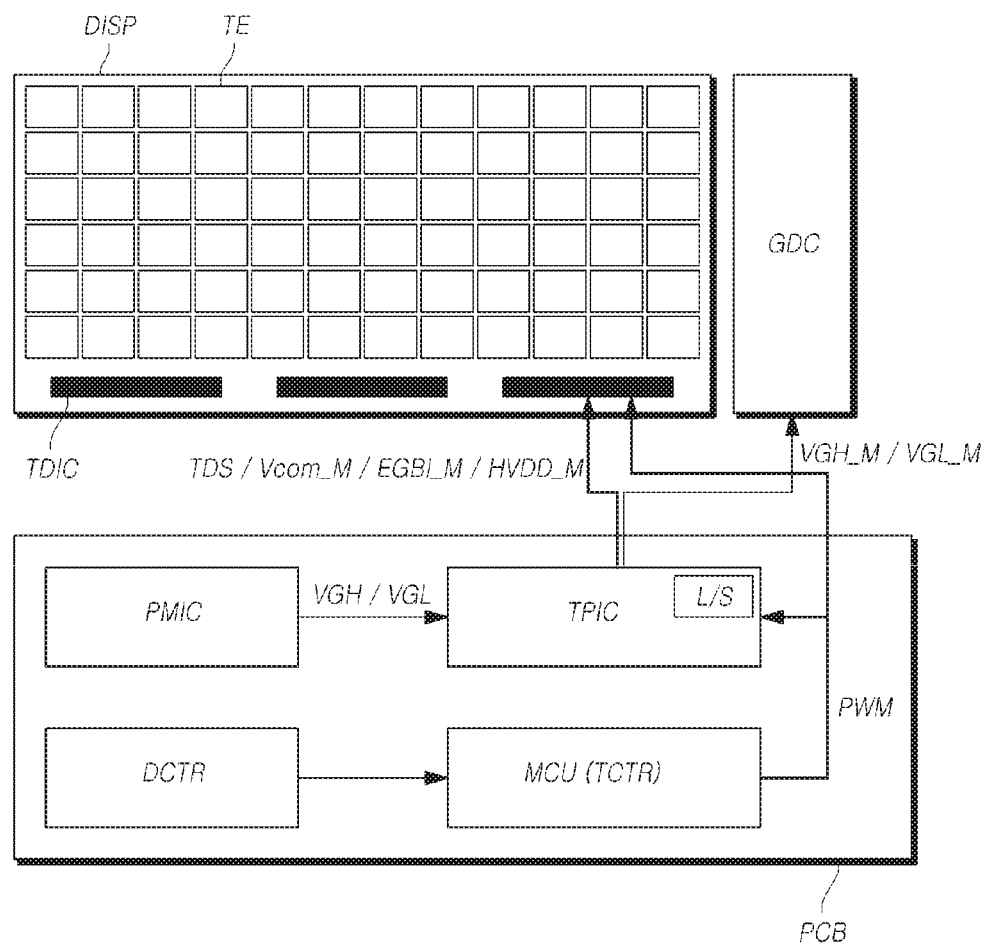
FIG. 21 illustrates a system configuration of the touch display device according to exemplary embodiments.

FIG. 21 illustrates a system configuration of the touch display device according to exemplary embodiments.

Referring to FIG. 21, the touch display device according to exemplary embodiments may include one or more integrated driving circuits TDIC in which a touch driving function of the touch driver circuit TDC and a data driving function of the data driver circuit DDC are integrated.

For example, as illustrated in FIG. 21, in a case in which the touch display device includes three integrated driving circuits TDIC, the plurality of touch electrodes TE are divided into three touch electrode groups, and each of the three integrated driving circuits TDIC drives one of the three touch electrode groups allocated thereto. In addition, the plurality of data lines DL are divided into three data line groups, and each of the integrated driving circuits TDIC drives one of the three data line groups allocated thereto.

As illustrated in FIG. 21, the touch controller TCTR will be described as being a microcontroller MCU. In addition, the touch display device may include a level shifter L/S, which may be provided within or externally of the touch power circuit TPIC.

As described above, in Case 1 or Case 3, when the touch electrode driving signal TDS is applied to touch electrodes TE subjected to sensing, among the plurality of touch electrodes TE, a pulse signal, the frequency and phase of which correspond to the frequency and phase of the touch electrode driving signal TDS, may be applied to touch electrodes TE not subjected to sensing, among the plurality of touch electrodes TE, the data lines DL, the gate lines GL, etc.

Describing the load free driving in the point of view of the touch electrodes TE, the touch driver circuit TDC may drive the entirety of the plurality of touch electrodes TE at a specific point in time. In addition, the touch driver circuit TDC may drive only a portion of a plurality of touch electrodes TE at a specific point in time.

In Case 1 or Case 3, even in the case that the entirety or a portion of a plurality of touch electrodes TE are driven at any point in time, the touch driver circuit TDC sequentially senses a predetermined number of touch electrodes TE among the driven touch electrodes TE (i.e., a specific number of touch electrodes TE which can be simultaneously sensed, among the driven touch electrodes TE).

For example, among the touch electrodes TE, to which the touch electrode driving signal TDS corresponding to the first touch electrode driving signal TDS1 or the third touch electrode driving signal TDS3 is applied, a predetermined number of touch electrodes TE are subjected sensing at a point in time, while the remaining touch electrodes TE are not subjected to sensing. Here, the predetermined number is the number of touch electrodes that can be simultaneously sensed.

The touch electrode driving signal TDS, applied to the touch electrodes TE not subjected to sensing, may also be referred to as a touch-load free driving signal (T-LFDS).

For the sake of brevity, it will be described hereinafter that the touch electrode driving signal TDS is applied to the sensing electrodes TE subjected to sensing and the touch-load free driving signal T-LFDS is applied to the touch electrodes TE not subjected to sensing. The touch-load free driving signal may be described as being Vcom_M.

Considering the load free driving, while the touch driver circuit TDC is outputting the touch electrode driving signal TDS to one or more sensing touch electrodes among the plurality of touch electrodes TE, the touch driver circuit TDC or the touch power circuit TPIC may apply the touch-load free driving signal in the form of a pulse signal to the one or more sensing touch electrodes, to which the touch electrode driving signal TDS is applied, and the other touch electrodes not subjected to sensing.

The touch-load free driving signal is a type of touch electrode driving signal TDS applied to the non-sensing touch electrodes, and may be indicated with Vcom_M. The touch-load free driving signal may be the touch electrode driving signal TDS or a signal corresponding to the touch electrode driving signal TDS.

The frequencies and phases of the touch-load free driving signal and the touch electrode driving signal TDS may be the same or substantially similar within a predetermined tolerance range, and the amplitudes thereof may be the same or similar within a predetermined tolerance range.

In addition, describing the load free driving in the point of view of the data lines DL, in Case 1, while the touch driver circuit TDC is outputting the touch electrode driving signal TDS to one or more touch electrodes among the plurality of touch electrodes TE, the data driver circuit DDC may output the data signal Vdata in response to the gamma reference voltage EGBI_M in the form of a pulse signal.

In Case 3, while the touch driver circuit TDC is outputting the touch electrode driving signal TDS to one or more touch electrodes among the plurality of touch electrodes TE, the data driver circuit DDC may output the data signal Vdata corresponding to the load free driving signal. Here, the frequencies and phases of the data signal Vdata and the touch electrode driving signal TDS, corresponding to the load free driving signal, may be the same or substantially similar within a predetermined tolerance range, and the amplitudes thereof may be the same or similar within a predetermined tolerance range.

In addition, describing the load free driving in the point of view of the gate lines GL, the gate driver circuit GDC may receive the low-level gate voltage VGL_M and the high-level gate voltage VGH_M, in the form of pulse signals corresponding to the touch electrode driving signal TDS, and based on the received voltages, supply the gate signal Vgate to the gate lines GL. The gate signal Vgate may be referred to as the load free driving signal for the gate lines GL.

As described above, for the load free driving, a variety of signals applied to the display panel DISP may be applied in the form of a pulse signal.

Accordingly, the microcontroller MCU corresponding to the touch controller TCTR may generate a reference pulse signal PWM and provide the reference pulse signal PWM to a variety of circuits, such as the touch power circuit TPIC, the touch driver circuit TDC, the data driver circuit DDC, and the level shifter L/S.

The variety of circuits, such as the touch power circuit TPIC, the touch driver circuit TDC, the data driver circuit DDC, and the level shifter L/S, generate necessary pulse signals using the reference pulse signal PWM, received from the microcontroller MCU, and output the generated pulse signals.

The reference pulse signal PWM, output from the microcontroller MCU, is a variable voltage signal comprised of a plurality of pulses.

In the reference pulse signal PWM, output from the microcontroller MCU, the width, the amplitude, the phase, and the like of the reference pulse signal PWM, continuously change, and may be referred to as a pulse modulated signal. In the specification, the reference pulse signal PWM output from the microcontroller MCU will be regarded as a pulse width modulated signal. However, the present disclosure is not limited thereto, and a variety of pulse modulated signals may be used.

Referring to FIG. 21, at least one printed circuit board PCB may be electrically connected to an outer portion of the display panel DISP.

The printed circuit board PCB may be directly connected to an outer bonding area of the display panel DISP or may be connected to the display panel DISP via a printed circuit (e.g., a flexible printed circuit (FPC)) connected to the outer bonding area of the display panel DISP.

The microcontroller MCU, the display controller DCTR, the touch power circuit TPIC, the power management circuit PMIC, etc., may be mounted on the printed circuit board PCB, and may be electrically connected to each other via lines disposed in the printed circuit board PCB.

Figure 22:
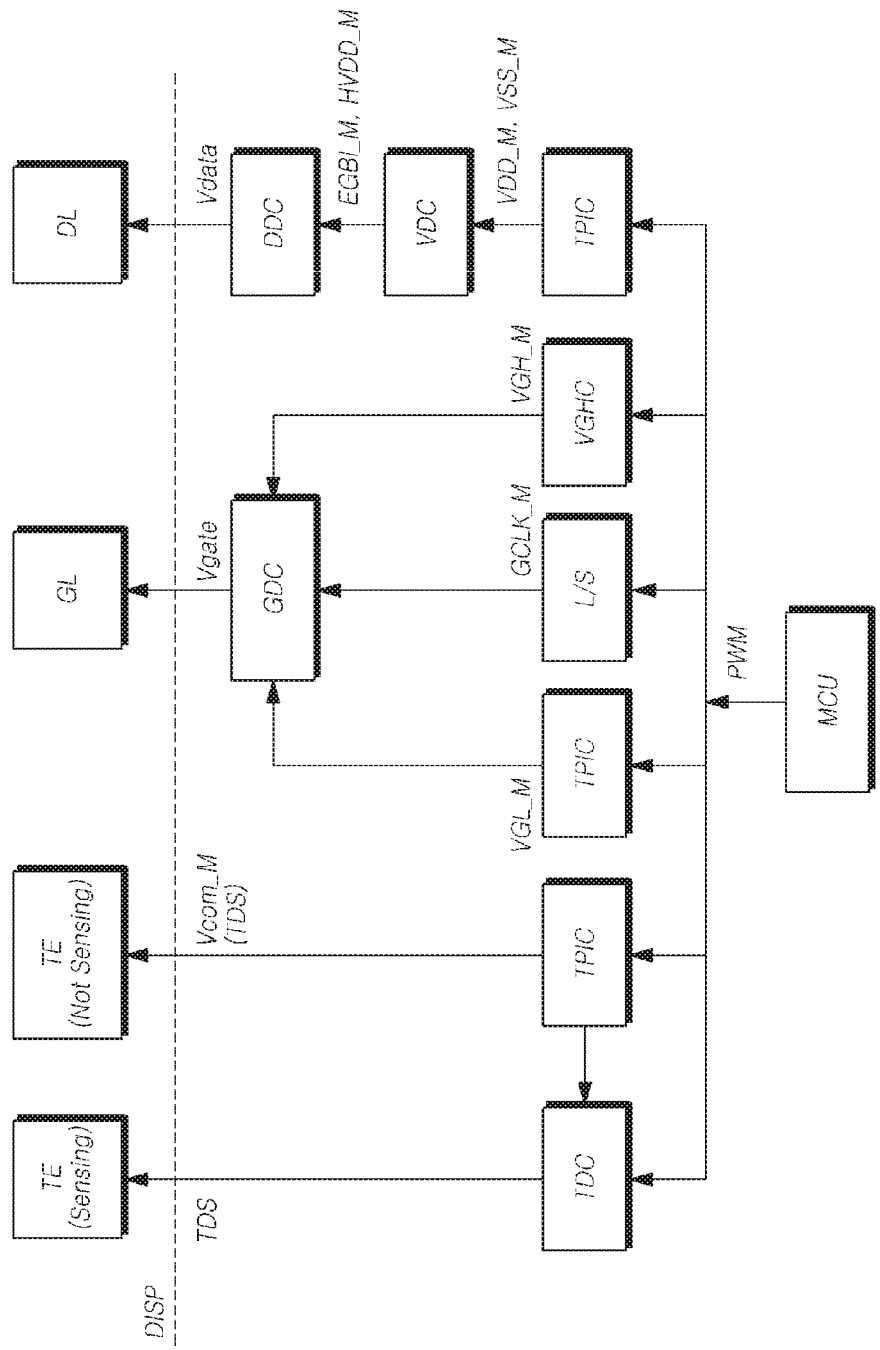
FIG. 22 illustrates touch electrode driving, gate line driving, and data line driving using a single reference pulse signal generated by the microcontroller in the touch display device according to exemplary embodiments.

FIG. 22 illustrates touch electrode driving, gate line driving, and data line driving using a single reference pulse signal PWM generated by the microcontroller MCU in the touch display device according to exemplary embodiments.

Referring to FIG. 22, the microcontroller MCU may generate a single reference pulse signal PWM, and may supply the single reference pulse signal PWM generated thereby to the touch driver circuit TDC, the touch power circuit TPIC, the level shifter L/S, a high-level gate voltage generator circuit VGHC, etc.

First, the touch electrode driving will be described below.

The touch driver circuit TDC may output the touch electrode driving signal TDS to touch electrodes TE, subjected to sensing, by using the reference pulse signal PWM output from the microcontroller MCU. Here, the touch electrode driving signal TDS is a signal generated on the basis of the reference pulse signal PWM. The touch electrode driving signal TDS may be the reference pulse signal PWM itself, or may be generated such that the frequency, phase, amplitude, etc., thereof correspond to those of the reference pulse signal PWM.

In a different transmission method, the touch driver circuit TDC may receive the touch electrode driving signal TDS, generated on the basis of the reference pulse signal PWM output from the microcontroller MCU, from the touch power circuit TPIC, and may output the received touch electrode driving signal TDS to the touch electrodes TE subjected to sensing.

The touch power circuit TPIC may output the pulse signal Vcom_M to the touch electrodes TE, not subjected to sensing, by using the reference pulse signal PWM output from the microcontroller MCU. The pulse signal Vcom_M is a type of touch electrode driving signal TDS, and is functionally a touch-load free driving signal. Here, the pulse signal Vcom_M, a touch-load free driving signal, may be a signal generated on the basis of the reference pulse signal PWM. The pulse signal Vcom_M may be the reference pulse signal PWM itself, or may be generated such that the frequency, phase, amplitude, etc., thereof, correspond to those of the reference pulse signal PWM.

Next, the gate line driving will be described as follows.

The touch power circuit TPIC may output the low-level gate voltage VGL_M, a pulse signal, to the gate driver circuit GDC by using the reference pulse signal PWM output from the microcontroller MCU.

The level shifter L/S may output a gate clock signal GCLK_M, a pulse signal, to the gate driver circuit GDC by using the reference pulse signal PWM output from the microcontroller MCU.

The high-level gate voltage generator circuit VGHC may output the high-level gate voltage VGH_M, a pulse signal, to the gate driver circuit GDC by using the reference pulse signal PWM output from the microcontroller MCU.

The gate driver circuit GDC may generate the gate signal Vgate using the gate clock signal GCLK_M, the low-level gate voltage VGL_M, the high-level gate voltage VGH_M, etc., corresponding to pulse signals, and output the generated gate signal Vgate to the gate lines GL.

The above-stated high-level gate voltage generator circuit VGHC may be implemented as a multiplexer or the like.

In addition, the high-level gate voltage generator circuit VGHC may be separately provided externally of the touch power circuit TPIC, such as the level shifter L/S and/or the high-level gate voltage generator circuit VGHC, or may be provided within the touch power circuit TPIC.

Subsequently, the data line driving will be described as follows.

The touch power circuit TPIC generates and outputs the modulated driving voltage VDD_M, the modulated base voltage VSS_M, etc., in the form of pulse signals, as illustrated in FIG. 17, using the reference pulse signal PWM output from the microcontroller MCU.

The voltage distribution circuit VDC (VDC1 to VDC5 in FIG. 18) generates and outputs the gamma reference voltages EGBI_M (EGBI1_M, EGBI2_M, EGBI3_M, and EGBI4_M) and the half driving voltage HVDD_M, in the form of pulse signals, using the modulated driving voltage VDD_M and the modulated base voltage VSS_M in the form of pulse signals.

The data driver circuit DDC may generate the data signal Vdata using the gamma reference voltages EGBI_M (EGBI1_M, EGBI2_M, EGBI3_M, and EGBI4_M) and the half driving voltage HVDD_M in the form of pulse signals, and output the generated data signal Vdata to the data lines DL.

The above-stated voltage distribution circuit VDC (VDC1 to VDC5 in FIG. 18) may be provided externally of the touch power circuit TPIC as a separate circuit, or may be included within the touch power circuit TPIC.

Figure 23:
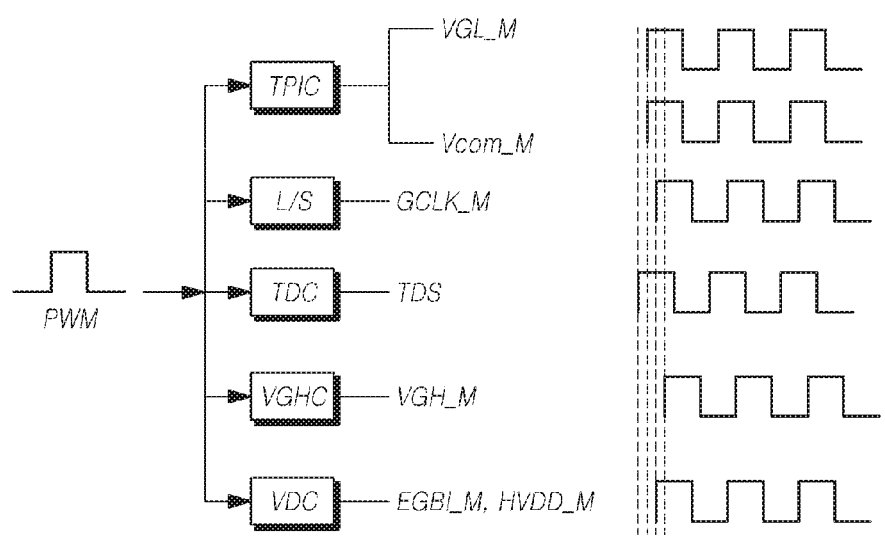
FIG. 23 illustrates propagation delay variations among pulse signals, generated on the basis of a single reference pulse signal generated by the microcontroller, in the touch display device according to exemplary embodiments.

FIG. 23 illustrates propagation delay variations among pulse signals VGL_M, Vcom_M, GCLK_M, TDS, VGH_M, EGBI_M, and HVDD_M, generated on the basis of a single reference pulse signal PWM generated by the microcontroller MCU, in the touch display device according to exemplary embodiments.

Referring to FIG. 23, the pulse signals VGL_M, Vcom_M, GCLK_M, TDS, VGH_M, EGBI_M, and HVDD_M are generated on the basis of the single reference pulse signal PWM generated by the microcontroller MCU.

However, the pulse signals VGL_M, Vcom_M, GCLK_M, TDS, VGH_M, EGBI_M, and HVDD_M are generated by a variety of devices, such as TPIC, L/S, TDC, VGHC, and VDC, instead of being generated by the same device.

In addition, there may be different paths from the microcontroller MCU to the variety of devices, such as TPIC, L/S, TDC, VGHC, and VDC, and the lengths of the paths may be different.

In other words, although the pule signals VGL_M, Vcom_M, GCLK_M, TDS, VGH_M, EGBI_M, and HVDD_M are generated on the basis of the single reference pulse signal PWM output from the microcontroller MCU, such signals are generated by different subjects (i.e., generators). In addition, the paths from the microcontroller MCU to the subjects generating such pule signals are different, and the lengths thereof are also different. Such a phenomenon is referred to as propagation delay variations (propagation time differences).

Due to the propagation delay variations, as illustrated in FIG. 23, the variety of pulse signals VGL_M, Vcom_M, GCLK_M, TDS, VGH_M, EGBI_M, and HVDD_M, generated on the basis of the single reference pulse signal PWM output from the microcontroller MCU, may have different phases.

In the case of time division driving, when the load free driving is performed, the touch electrode driving signal TDS, the data signal Vdata, the gate signal Vgate, etc., applied to the display panel DISP may have different phases, due to the propagation delay variations, although the phases are required to be the same as illustrated in FIG. 5.

In addition, in Case 1 (in which the display driving and the touch driving are simultaneously performed during the active period) and Case 3 (in which the touch driving is only performed during the blank period) of the time free driving, the touch electrode driving signal TDS1 applied to the display panel DISP, the data signal Vdata, the gate signal Vgate, the low-level gate voltage VGL_M on the printed circuit board PCB, etc., may have different phases due to the propagation delay variations, although the phases thereof are required to be the same as illustrated in FIGS. 9, 19, and 20.

Accordingly, the effect of the load free driving may be reduced in the case of both the time division driving and the time free driving, thereby degrading touch sensing performance.

In addition, in Case 1 of the time free driving, the high- and low-level gate voltages VGH_M and VGL_M, the gate signal Vgate generated using the voltages VGH_M and VGL_M, the gamma reference voltage EGBI_M, the half driving voltage HVDD_M, and the data signal Vdata generated using the voltages EGBI_M and HVDD_M may have an adverse effect on the image display, thereby significantly degrade display performance.

Hereinafter, a method of compensating for propagation delay variations, for improving touch sensing performance and display performance by reducing the propagation delay variations, will be described.

Figure 24:
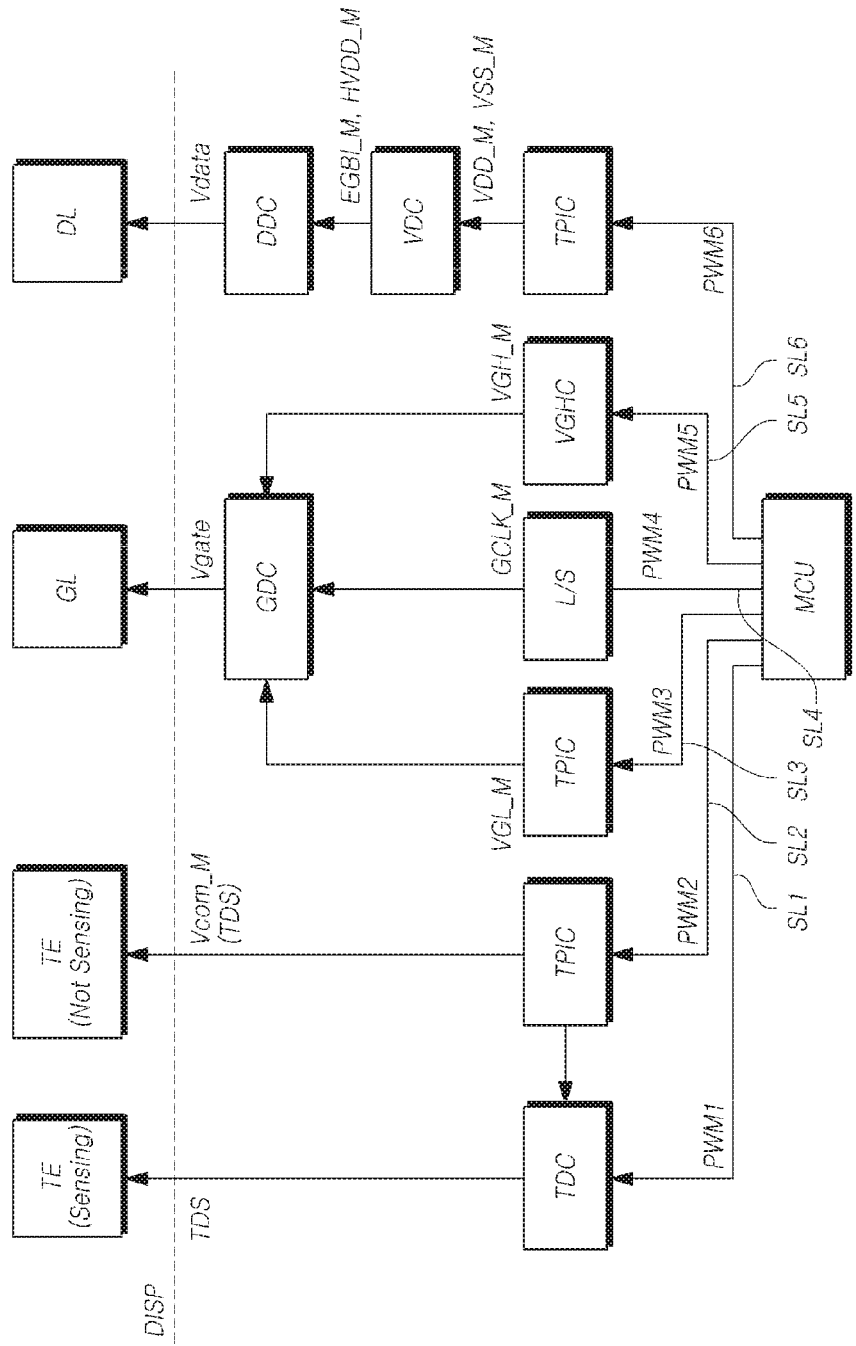
FIG. 24 illustrates touch electrode driving, gate line driving, and data line driving using a variety of reference pulse signals generated by the microcontroller in the touch display device according to exemplary embodiments.

FIG. 24 illustrates touch electrode driving, gate line driving, and data line driving using a variety of reference pulse signals PWM1 to PWM6 generated by the microcontroller MCU in the touch display device according to exemplary embodiments.

Referring to FIG. 24, the microcontroller MCU may generate two or more reference pulse signals PWM1 to PWM6, and supply the generated two or more reference pulse signals PWM to the touch driver circuit TDC, the touch power circuit TPIC, the level shifter L/S, the high-level gate voltage generator circuit VGHC, etc.

First, the touch electrode driving will be described below.

The touch driver circuit TDC may receive the first reference pulse signal PWM1 from the microcontroller MCU through a first signal line SL1 on the printed circuit board PCB and the like, and output the touch electrode driving signal TDS to the touch electrodes TE subjected to sensing, on the basis of the first reference pulse signal PWM1. Here, the touch electrode driving signal TDS is a signal generated on the basis of the first reference pulse signal PWM1. The touch electrode driving signal TDS may be the first reference pulse signal PWM1 itself or a signal generated such that the frequency, phase, amplitude, etc., thereof correspond to those of the first reference pulse signal PWM1.

In another transmission method, the touch driver circuit TDC may receive the touch electrode driving signal TDS, generated on the basis of a third reference pulse signal PWM3 output from the microcontroller MCU, from the touch power circuit TPIC, and output the received touch electrode driving signal TDS to the touch electrodes TE subjected to sensing.

The touch power circuit TPIC may receive the third reference pulse signal PWM3 from the microcontroller MCU through a third signal line SL3 on the printed circuit board PCB, and output the pulse signal Vcom_M to the touch electrodes TE not subjected to sensing, on the basis of the third reference pulse signal PWM3. The pulse signal Vcom_M is a type of touch electrode driving signal TDS, and is functionally a touch-load free driving signal. Here, the pulse signal Vcom_M, a touch-load free driving signal, is a signal generated on the basis of the third reference pulse signal PWM3. The pulse signal Vcom_M may be the third reference pulse signal PWM3 itself or a signal generated such that the frequency, phase, amplitude, etc., thereof correspond to those of the third reference pulse signal PWM3.

Next, the gate line driving will be described as follows.

The touch power circuit TPIC may receive a second reference pulse signal PWM2 from the microcontroller MCU through a second signal line SL on the printed circuit board PCB, and output the low-level gate voltage VGL_M in the form of a pulse signal to the gate driver circuit GDC, on the basis of the second reference pulse signal PWM2.

The level shifter L/S may receive a sixth reference pulse signal PWM6 from the microcontroller MCU through a sixth signal line SL6 on the printed circuit board PCB, and output the gate clock signal GCLK_M in the form of a pulse signal to the gate driver circuit GDC, on the basis of the sixth reference pulse signal PWM6.

The high-level gate voltage generator circuit VGHC may receive a fifth reference pulse signal PWM5 from the microcontroller MCU through a fifth signal line SL on the printed circuit board PCB, and output the high-level gate voltage VGH_M in the form of a pulse signal to the gate driver circuit GDC, on the basis of the fifth reference pulse signal PWM5.

The gate driver circuit GDC may generate the gate signal Vgate using the gate clock signal GCLK_M, the low-level gate voltage VGL_M, the high-level gate voltage VGH_M, etc., corresponding to pulse signals, and output the gate signal Vgate to the gate lines GL.

The above-stated high-level gate voltage generator circuit VGHC may be implemented as a multiplexer or the like.

In addition, although level shifter L/S and the high-level gate voltage generator circuit VGHC may be provided externally of the touch power circuit TPIC as separate circuits, the level shifter L/S and the high-level gate voltage generator circuit VGHC may be included within the touch power circuit TPIC.

Next, the data line driving will be described as follows.

The touch power circuit TPIC may receive a fourth reference pulse signal PWM4 from the microcontroller MCU through a fourth signal line SL4 on the printed circuit board PCB, and generate and output the modulated driving voltage VDD_M, the modulated base voltage VSS_M, etc., in the form of pulse signals, as illustrated in FIG. 17.

The voltage distribution circuit VDC (VDC1 TO VDC5 in FIG. 18) may generate and output the gamma reference voltages EGBI_M (EGBI1_M, EGBI2_M, EGBI3_M, and EGBI4_M) and the half driving voltage HVDD_M in the form of pulse signals, using the modulated driving voltage VDD_M and the modulated base voltage VSS_M in the form of pulse signals.

The data driver circuit DDC may generate the data signal Vdata using the gamma reference voltages EGBI_M (EGBI1_M, EGBI2_M, EGBI3_M, and EGBI4_M) and the half driving voltage HVDD_M, in the form of pulse signals, and output the data signal Vdata to the data lines DL.

Although the above-stated voltage distribution circuit VDC (VDC1 TO VDC5 in FIG. 18) may be provided externally of the touch power circuit TPIC as separate circuits, the voltage distribution circuit VDC may be included within the touch power circuit TPIC.

As described above, pulse signals, applied to at least one of the printed circuit board PCB or the display panel DISP, may be generated using two or more reference pulse signals PWM1 to PWM6, instead of being generated using a single reference pulse signal PWM.

The pulse signals, applied to at least one of the printed circuit board PCB or the display panel DISP, may include pulse signals GCLK_M, VGL_M, VGH_M, VDD_M, VSS_M, EGBI_M, HVDD_M, etc., output from the circuit components (e.g., TPIC, L/S, VGHC, VDC, and multiplexers) mounted on the printed circuit board PCB, and pulse signals TDS, Vcom_M, Vgate, Vdata, etc., input to the display panel DISP.

Referring to FIG. 24, all of the first to sixth reference pulse signals PWM1 to PWM6 may be different signals, or some of the first to sixth reference pulse signals PWM1 to PWM6 may be the same signals. Accordingly, all of the first to sixth signal lines SL1 to SL6 may be different lines, or some of the first to sixth signal lines SL1 to SL6 may be the same lines.

Figure 25:
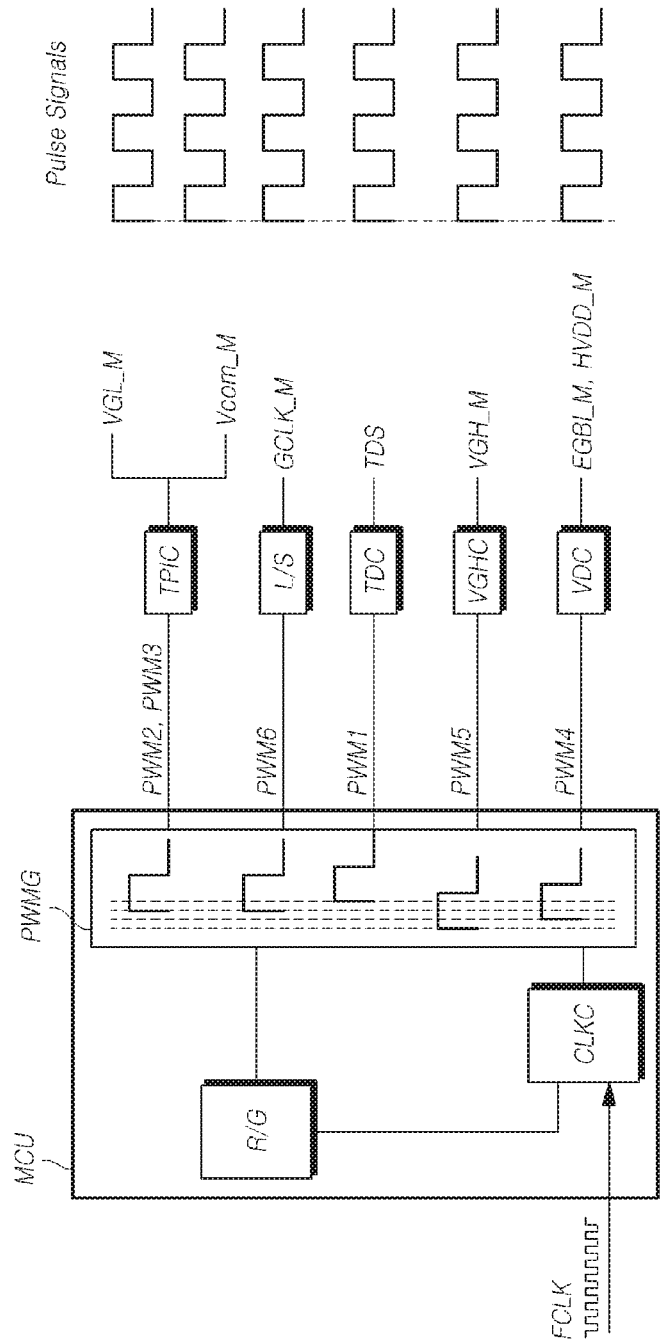
FIG. 25 illustrates a compensation method in the touch display device according to exemplary embodiments, in which the microcontroller compensates for propagation delay variations among pulse signals by outputting the reference pulse signals having various phase differences.

FIG. 25 illustrates a compensation method in the touch display device according to exemplary embodiments, in which the microcontroller MCU compensates for propagation delay variations among pulse signals by outputting the reference pulse signals PWM1 to PWM6 having various phase differences.

The touch display device according to exemplary embodiments may include the display panel DISP, the at least one printed circuit board PCB electrically connected to the display panel DISP, etc.

The gate driver circuit GDC may be implemented using a COF structure, a GIP structure, etc., electrically connected to the display panel DISP, and may sequentially output the gate signal Vgate to the plurality of gate lines GL.

The data driver circuit DDC may be implemented using a COF structure, a COG structure, etc., electrically connected to the display panel DISP, and may output the data signal Vdata to the plurality of data lines DL.

The touch driver circuit TDC may be implemented using a COF structure, a COG structure, etc., electrically connected to the display panel DISP, or may be mounted on the printed circuit board PCB electrically connected to the display panel DISP. The touch driver circuit TDC may output the touch electrode driving signal TDS to one or more touch electrodes TE among the plurality of touch electrodes TE.

The touch display device according to exemplary embodiments may further include the touch power circuit TPIC electrically connected to at least one of the gate driver circuit GDC, the data driver circuit DDC, the touch driver circuit TDC, etc., to supply a variety of voltages or signals thereto.

The touch display device according to exemplary embodiments may further include the microcontroller MCU supplying the reference pulse signals serving as references for pulse signals output by a variety of signal supply components, such as the gate driver circuit GDC, the data driver circuit DDC, the touch driver circuit TDC, and the touch power circuit TPIC. The microcontroller MCU also serves as the touch controller TCTR determining at least one of a touch or touch coordinates.

The touch power circuit TPIC, the microcontroller MCU, etc., may be mounted on the printed circuit board PCB. The display controller DCTR, the power management circuit PMIC, etc., may further be mounted on the printed circuit board PCB.

Referring to FIG. 25, the microcontroller MCU may include a register R/G storing information regarding the two or more reference pulse signals PWM1 to PWM6, a signal generator PWMG generating and outputting the two or more reference pulse signals PWM1 to PWM6, etc.

The signal generator PWMG may generate and output the two or more reference pulse signals PWM1 to PWM6 having the same frequency.

The signal generator PWMG may generate and output a phase difference between the two or more reference pulse signals PWM1 to PWM6.

In particular, the signal generator PWMG may generate and output a phase difference between the two or more reference pulse signals PWM1 to PWM6, so that a plurality of pulse signals generated by one or more external signal supply components, such as TPIC, L/S, TDC, VGHC, and VDC, on the basis of the two or more reference pulse signals PWM1 to PWM6, have the same phase on the display panel DISP or the printed circuit board PCB.

Due to this function of the microcontroller MCU, the phase difference between the pulse signals due to the above-stated propagation delay variations can be removed, thereby improving touch sensing performance and display performance.

Hereinafter, these features will be described by way of example.

The microcontroller MCU may output two or more reference pulse signals PWM1 to PWM6 including the first reference pulse signal PWM1 and one or more other reference pulse signals PWM2 to PWM6.

The touch electrode driving signal TDS may be generated on the basis of the first reference pulse signal PWM1.

In Case 1 and Case 3 in which the touch driving is performed according to the time division driving method or the touch driving is performed according to the time free driving method, the load free driving may be performed while the touch electrode driving signal TDS is being applied to one or more touch electrodes TE.

As described above, in the touch display device according to exemplary embodiments, according to the load free driving, one or more pulse signals VGL_M, Vcom_M, EGBI_M/HVDD_M, VGH_M, and GCLK_M, generated on the basis of the first reference pulse signal PWM1 and the other reference pulse signals PWM2 to PWM6, may be applied to the display panel DISP or the printed circuit board PCB while the touch electrode driving signal TDS is being applied to one or more touch electrodes TE.

Referring to FIG. 25, the first reference pulse signal PWM1 and the other reference pulse signals PWM2 to PWM6, output from the microcontroller MCU, may have the same frequency.

The touch electrode driving signal TDS, generated on the basis of the first reference pulse signal PWM1, and the one or more pulse signals VGL_M, Vcom_M, EGBI_M/HVDD_M, VGH_M, and GCLK_M, generated on the basis of the other reference pulse signals PWM2 to PWM6, may have corresponding phases. That is, the touch electrode driving signal TDS, generated on the basis of the first reference pulse signal PWM1, is in phase with the one or more pulse signals VGL_M, Vcom_M, EGBI_M/HVDD_M, VGH_M, and GCLK_M, generated on the basis of the other reference pulse signals PWM2 to PWM6, may have corresponding phases.

However, the first reference pulse signal PWM1 has a different phase from the other reference pulse signals PWM2 to PWM6. That is, the microcontroller MCU may output the first reference pulse signal PWM1 and the other reference pulse signals PWM2 to PWM6 in the out-of-phase state.

Referring to FIGS. 24 and 25, the microcontroller MCU may output the second reference pulse signal PWM2 different from the first reference pulse signal PWM1.

The gate driver circuit GDC may receive the low-level gate voltage VGL_M, i.e., a pulse signal generated by the touch power circuit TPIC, on the basis of the second reference pulse signal PWM2.

The touch electrode driving signal TDS, generated on the basis of the first reference pulse signal PWM1, and the low-level gate voltage VGL_M, generated on the basis of the second reference pulse signal PWM2, may have the same frequency.

The touch electrode driving signal TDS, generated on the basis of the first reference pulse signal PWM1, and the low-level gate voltage VGL_M, generated on the basis of the second reference pulse signal PWM2, may have the same phase.

However, the first reference pulse signal PWM1 and the second reference pulse signal PWM2 may have different phases.

More specifically, as illustrated in FIG. 25, for example, the microcontroller MCU may delay the output of the first reference pulse signal PWM1, so that than the first reference pulse signal PWM1 is later than the second reference pulse signal PWM2. That is, the microcontroller MCU may output the second reference pulse signal PWM2 at earlier timing than the first reference pulse signal PWM1.

Accordingly, the touch electrode driving signal TDS, generated on the basis of the first reference pulse signal PWM1, and the low-level gate voltage VGL_M, generated on the basis of the second reference pulse signal PWM2, may have the same phase.

Referring to FIGS. 24 and 25, the microcontroller MCU may output the third reference pulse signal PWM3 different from the first reference pulse signal PWM1.

While the touch electrode driving signal TDS, generated by the touch driver circuit TDC on the basis of the first reference pulse signal PWM1, is being applied to the one or more touch electrodes TE subjected to sensing, among the plurality of touch electrodes TE, the pulse signal Vcom_M, generated by the touch power circuit TPIC on the basis of the third reference pulse signal PWM3, may be applied to touch electrodes TE, other than the one or more touch electrodes TE subjected to sensing, among the plurality of touch electrodes TE.

The first reference pulse signal PWM1 and the third reference pulse signal PWM3 may have the same frequency.

The touch electrode driving signal TDS, generated on the basis of the first reference pulse signal PWM1, and the pulse signal Vcom_M, generated on the basis of the third reference pulse signal PWM3, may have the same phase.

However, the first reference pulse signal PWM1 and the third reference pulse signal PWM3 may have different phases.

More specifically, as illustrated in FIG. 25, for example, the microcontroller MCU may delay the output of first reference pulse signal PWM1, so that the first reference pulse signal PWM1 is later than the third reference pulse signal PWM3. That is, the microcontroller MCU may output the third reference pulse signal PWM3 at earlier timing than the first reference pulse signal PWM1.

Accordingly, the touch electrode driving signal TDS, generated on the basis of the first reference pulse signal PWM1, and the pulse signal Vcom_M, generated on the basis of the third reference pulse signal PWM3, may have the same phase.

Referring to FIGS. 24 and 25, the microcontroller MCU may output the fourth reference pulse signal PWM4 different from the first reference pulse signal PWM1.

The data driver circuit DDC may output the data signal Vdata in response to the gamma reference voltage EGBI_M and the half driving voltage HVDD_M, i.e., pulse signals generated by the touch power circuit TPIC and the voltage distribution circuit VDC on the basis of the fourth reference pulse signal PWM4 (see FIG. 14).

The touch electrode driving signal TDS, generated on the basis of the first reference pulse signal PWM1, and the gamma reference voltage EGBI_M, generated on the basis of the fourth reference pulse signal PWM4, may have the same frequency.

The touch electrode driving signal TDS, generated on the basis of the first reference pulse signal PWM1, and the gamma reference voltage EGBI_M, generated on the basis of the fourth reference pulse signal PWM4, may have the same phase.

However, the first reference pulse signal PWM1 and the fourth reference pulse signal PWM4 may have different phases.

More specifically, as illustrated in FIG. 25, for example, the microcontroller MCU may delay the output of first reference pulse signal PWM1, so that the first reference pulse signal PWM1 is later than the fourth reference pulse signal PWM4. That is, the microcontroller MCU may output the fourth reference pulse signal PWM4 at earlier timing than the first reference pulse signal PWM1.

Accordingly, the touch electrode driving signal TDS, generated on the basis of the first reference pulse signal PWM1, and the gamma reference voltage EGBI_M, generated on the basis of the fourth reference pulse signal PWM4, may have the same phase.

Referring to FIGS. 24 and 25, the microcontroller MCU may output the fifth reference pulse signal PWM5 different from the first reference pulse signal PWM1.

The gate driver circuit GDC may receive the high-level gate voltage VGH_M, i.e., a pulse signal generated by the high-level gate voltage generator circuit VGHC or the touch power circuit TPIC on the basis of the fifth reference pulse signal PWM5. The high-level gate voltage generator circuit VGHC may be implemented as a multiplexer, or may be included within the touch power circuit TPIC.

The touch electrode driving signal TDS, generated on the basis of the first reference pulse signal PWM1, and the high-level gate voltage VGH_M, generated on the basis of the fifth reference pulse signal PWM5, may have the same frequency.

The touch electrode driving signal TDS, generated on the basis of the first reference pulse signal PWM1, and the high-level gate voltage VGH_M, generated on the basis of the fifth reference pulse signal PWM5, may have the same phase.

However, the first reference pulse signal PWM1 and the fifth reference pulse signal PWM5 may have different phases.

More specifically, as illustrated in FIG. 25, for example, the microcontroller MCU may delay the output of first reference pulse signal PWM1, so that the first reference pulse signal PWM1 is later than the fifth reference pulse signal PWM5. That is, the microcontroller MCU may output the fifth reference pulse signal PWM5 at earlier timing than the first reference pulse signal PWM1.

Referring to FIGS. 24 and 25, the microcontroller MCU may output the sixth reference pulse signal PWM6 different from the first reference pulse signal PWM1.

The gate driver circuit GDC may receive the gate clock signal GCLK_M, i.e., a pulse signal generated by the level shifter L/S or the touch power circuit TPIC on the basis of the sixth reference pulse signal PWM6. The level shifter L/S may be included within the touch power circuit TPIC.

The touch electrode driving signal TDS, generated on the basis of the first reference pulse signal PWM1, and the gate clock signal GCLK_M, generated on the basis of the sixth reference pulse signal PWM6, may have the same frequency.

The touch electrode driving signal TDS, generated on the basis of the first reference pulse signal PWM1, and the gate clock signal GCLK_M, generated on the basis of the sixth reference pulse signal PWM6, may have the same phase.

However, the first reference pulse signal PWM1 and the sixth reference pulse signal PWM6 may have different phases.

More specifically, as illustrated in FIG. 25, for example, the microcontroller MCU may delay the output of first reference pulse signal PWM1, so that the first reference pulse signal PWM1 is later than the sixth reference pulse signal PWM6. That is, the microcontroller MCU may output the sixth reference pulse signal PWM6 at earlier timing than the first reference pulse signal PWM1.

All of the first to sixth reference pulse signals PWM1 to PWM6 may be different pulse signals, or some of the first to sixth reference pulse signals PWM1 to PWM6 may be the same pulse signals.

Referring to the illustration of FIG. 25, among the first to sixth reference pulse signals PWM1 to PWM6, the fifth reference pulse signal PWM5 is output at the earliest timing, the fourth reference pulse signal PWM4 is output subsequently, followed by the second, third, sixth reference pulse signals PWM2, PWM3, and PWM6, and the first reference pulse signal PWM1 may be output at the latest timing.

In a case in which the external signal supply components generate pulse signals on the basis of the first to sixth reference pulse signals PWM1 to PWM6, if any of the external signal supply components performs multiplexing using a higher voltage, the pulse signal generated by the corresponding reference pulse voltage may be more delayed. Thus, the reference pulse signal may be output from the microcontroller MCU at earlier timing than the remaining reference pulse signals.

Referring to FIG. 25, the signal generator PWMG of the microcontroller MCU may output the two or more reference pulse signals PWM1 to PWM6 by adjusting the phase differences between the two or more reference pulse signals PWM1 to PWM6, on the basis of the propagation time of each of the two or more reference pulse signals PWM1 to PWM6 stored in the register R/G as register values or propagation time differences (or propagation delay variations) between the two or more reference pulse signals PWM1 to PWM6.

Referring to FIG. 25, the microcontroller MCU may further include a clock counter CLKC to determine the propagation time differences between the two or more reference pulse signals PWM1 to PWM6 using fine clocks FCLK or intentionally create phase differences between the two or more reference pulse signals PWM1 to PWM6 using fine clocks FCLK.

Here, the propagation time differences between the two or more reference pulse signals PWM1 to PWM6 may mean propagation delay variations (or phase differences) between pulse signals generated by the one or more external signal supply components TPIC, L/S, TDC, VGHC, VDC, etc., on the basis of the two or more reference pulse signals PWM1 to PWM6.

The microcontroller MCU may receive fine clocks FCLK from an external source, or may generate fine clocks FCLK from the inside thereof.

Figure 26:
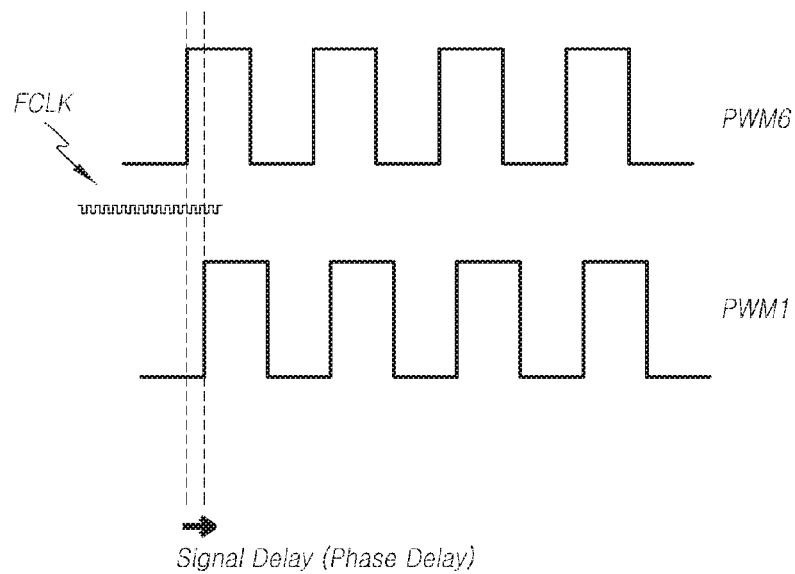
FIG. 26 illustrates a reference pulse generation method in the touch display device according to exemplary embodiments, in which the microcontroller generates reference pulse signals having a variety of phase differences.

FIG. 26 illustrates a reference pulse generation method in the touch display device according to exemplary embodiments, in which the microcontroller MCU generates reference pulse signals having a variety of phase differences.

Referring to FIG. 26, the signal generator PWMG of the microcontroller MCU may determine the propagation time differences between the two or more reference pulse signals PWM1 to PWM6 using the clock counter CLKC, on the basis of fine clocks FCLK, or create the phase differences between the two or more reference pulse signals PWM1 to PWM6 using the clock counter CLKC, on the basis of fine clocks FCLK.

For example, the microcontroller MCU may generate a different first reference pulse signal PMW1 by counting an intended number of fine clocks FCLK (e.g., two fine clocks in the illustration of FIG. 26) and shifting the sixth reference pulse signal PWM6 by the counted number of fine clocks. Thus, a phase difference may be caused between the first reference pulse signal PWM1 and the sixth reference pulse signal PWM6. That is, the first reference pulse signal PWM1 may be delayed (i.e., phase-delayed) than the sixth reference pulse signal PWM6.

Figure 27:
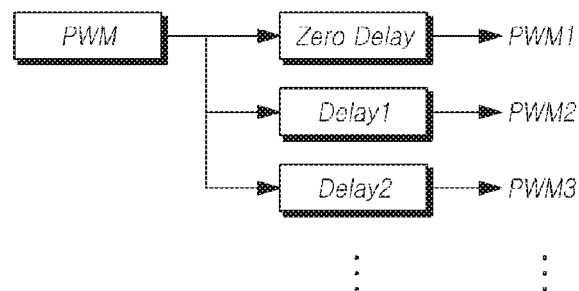
FIG. 27 illustrates a compensation method in the touch display device according to exemplary embodiments, in which propagation delay variations between pulse signals, generated by the one or more external signal supply components on the basis of the reference pulse signals generated by the microcontroller, are compensated for using set values of the register.

FIG. 27 illustrates a compensation method in the touch display device according to exemplary embodiments, in which propagation delay variations between pulse signals, generated by the one or more external signal supply components TPIC, L/S, TDC, VGHC, VDC, etc., on the basis of the reference pulse signals PWM1 to PWM6 generated by the microcontroller MCU, are compensated for using set values Zero Delay, Delay1, Delay2, and . . . of the register R/G.

Referring to FIG. 27, the signal generator PWMG of the microcontroller MCU may generate reference pulse signals PWM1 to PWM6 having signal delay differences (or phase differences), on the basis of a single initial reference pulse signal PWM, using the set values Zero Delay, Delay1, Delay2, and . . . regarding the reference pulse signals PWM1 to PWM6 stored in the register R/G.

The set values Zero Delay, Delay1, Delay2, and . . . regarding the reference pulse signals PWM1 to PWM6 stored in the register R/G may be pieces of information regarding the two or more reference pulse signals PWM1 to PWM6, and may be the propagation time of each of the two or more reference pulse signals PWM1 to PWM6 or propagation time differences (or propagation delay variations) between the two or more reference pulse signals PWM1 to PWM6.

Here, the propagation time differences between the two or more reference pulse signals PWM1 to PWM6 may mean propagation delay variations (or phase differences) between pulse signals generated by the one or more external signal supply components TPIC, L/S, TDC, VGHC, VDC, etc., on the basis of the two or more reference pulse signals PWM1 to PWM6.

The signal generator PWMG may generate the reference pulse signals PWM1 to PWM6 having signal delay differences (or phase differences) using the clock counter CLKC.

FIGS. 28 to 31 illustrate a compensation method in the touch display device according to exemplary embodiments, in which propagation delay variations between pulse signals, generated by the microcontroller MCU on the basis of reference pulse signals generated, are compensated for using feedback lines FBL_TDIC, FBL_TPIC, and FBL_GDC.

Figure 28:
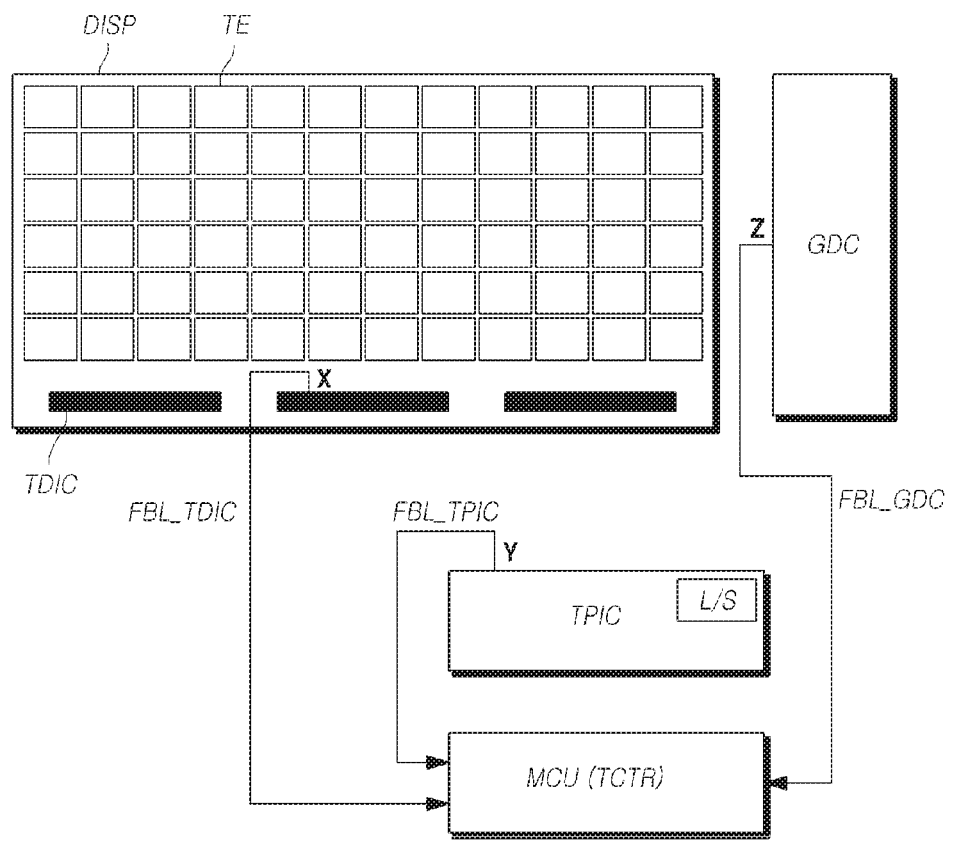
FIGS. 28 to 31 illustrate a compensation method in the touch display device according to exemplary embodiments, in which propagation delay variations between pulse signals, generated by the microcontroller on the basis of reference pulse signals generated, are compensated for using feedback lines.
Figure 29:
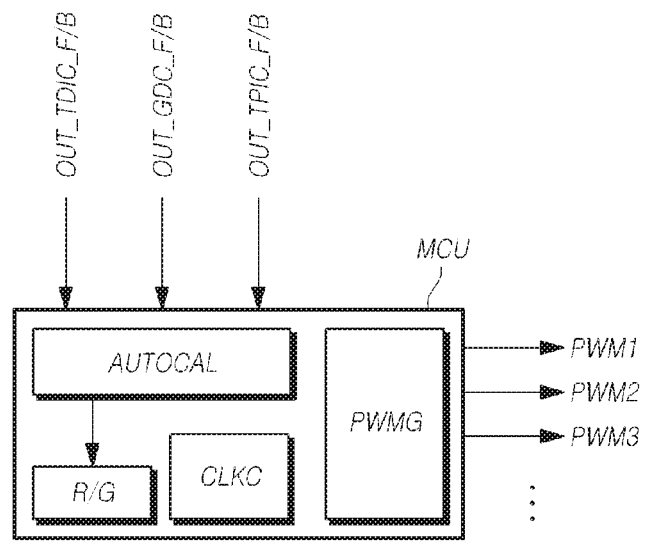

Referring to FIGS. 28 and 29, the touch display device may further include two or more feedback lines FBL_TDIC, FBL_TPIC, and FBL_GDC extending from output points X, Y, and Z of two or more of the data driver circuit DDC, the gate driver circuit GDC, the touch driver circuit TDC, the touch power circuit TPIC, etc., to the microcontroller MCU.

The two or more feedback lines FBL_TDIC, FBL_TPIC, and FBL_GDC may be disposed on the printed circuit board PCB. The two or more feedback lines FBL_TDIC, FBL_TPIC, and FBL_GDC may be connected to output ends of the data driver circuit DDC, the gate driver circuit GDC, the touch driver circuit TDC, etc. In some cases, a portion of the two or more feedback lines FBL_TDIC, FBL_TPIC, and FBL_GDC may be disposed in the display panel DISP.

Figure 30:
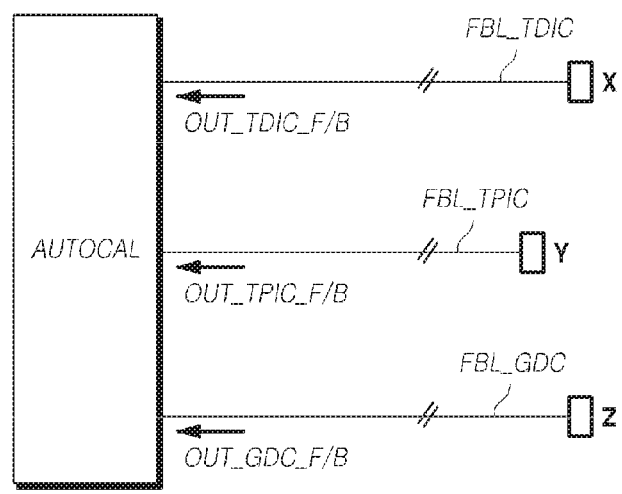

Referring to FIGS. 29 and 30, the microcontroller MCU may further include an automatic compensator AUTOCAL to determine the propagation time of each of the two or more reference pulse signals PWM1 to PWM6 or propagation time differences between the two or more reference pulse signals PWM1 to PWM6 using the two or more feedback lines FBL_TDIC, FBL_TPIC, and FBL_GDC and store the propagation times or the propagation time differences in the register R/G.

Referring to FIG. 29, the automatic compensator AUTOCAL may determine the propagation time of each of the two or more reference pulse signals PWM1 to PWM6 or propagation time differences between the two or more reference pulse signals PWM1 to PWM6, on the basis of two or more feedback pulse signals OUT_TDIC_F/B, OUT_GDC_F/B, and OUT_TPIC_F/B input through the two or more feedback lines FBL_TDIC, FBL_TPIC, and FBL_GDC, and store the propagation times or the propagation time differences in the register R/G.

Figure 31:
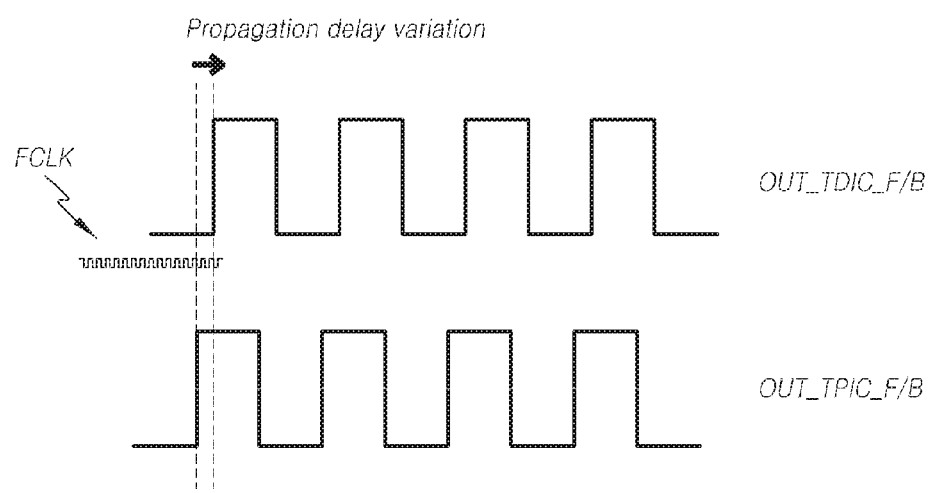

Referring to FIGS. 30 and 31, the automatic compensator AUTOCAL may output each of two or more test signals through a terminal, through which the two or more reference pulse signals PWM1 to PWM6 are output, receive the two or more feedback pulse signals OUT_TDIC_F/B, OUT_GDC_F/B, and OUT_TPIC_F/B responsive of the two or more test signals, through the two or more feedback lines FBL_TDIC, FBL_TPIC, and FBL_GDC, determine the propagation time of each of the two or more reference pulse signals PWM1 to PWM6 or propagation time differences between the two or more reference pulse signals PWM1 to PWM6, on the basis of two or more feedback pulse signals OUT_TDIC_F/B, OUT_GDC_F/B, and OUT_TPIC_F/B, and store the propagation times or the propagation time differences in the register R/G.

Here, the two or more test signals may be two or more reference pulse signals PWM1 to PWM6 or two or more dedicated test signals corresponding to the two or more reference pulse signals PWM1 to PWM6.

Referring to FIG. 30, when the two or more feedback pulse signals OUT_TDIC_F/B, OUT_GDC_F/B, and OUT_TPIC_F/B are received, the automatic compensator AUTOCAL may count the number of fine clocks FCLK corresponding to differences between the two or more feedback pulse signals OUT_TDIC_F/B, OUT_GDC_F/B, and OUT_TPIC_F/B using the clock counter CLKC, and on the basis of the number of counted fine clocks FCLK, determine the propagation time of each of the two or more reference pulse signals PWM1 to PWM6 or propagation time differences between the two or more reference pulse signals PWM1 to PWM6.

For example, the automatic compensator AUTOCAL may count the number of fine clocks FCLK corresponding to the difference between rising timing of the first feedback pulse signal OUT_TDIC_F/B received through the first feedback line FBL_TDIC and rising timing of the second feedback pulse signal OUT_TPIC_F/B received through the second feedback line FBL_TPIC, and determine a value corresponding to the number of counted fine clocks FCLK as a propagation time difference (or propagation delay variation) between the two or more reference pulse signals PWM1 to PWM6.

The driving method of the touch display device according to exemplary embodiments, as described above, will be briefly described again.

Figure 32:
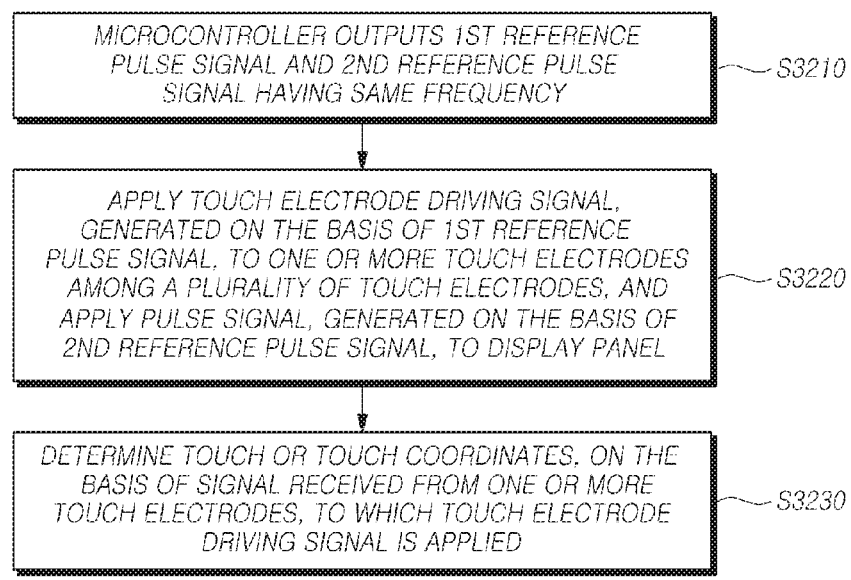
FIG. 32 is a flowchart illustrating a driving method of the touch display device according to exemplary embodiments.

FIG. 32 is a flowchart illustrating a driving method of the touch display device according to exemplary embodiments.

Referring to FIG. 32, the driving method of the touch display device according to exemplary embodiments may include: a step S3210 of outputting, by the microcontroller MCU, a first reference pulse signal PWM1 and one or more other reference pulse signals having the same frequency as the first reference pulse signal PWM1; a step S3220 of applying, by the touch driver circuit TDC, a touch electrode driving signal TDS, i.e., a pulse signal generated on the basis of the first reference pulse signal PWM1, to one or more touch electrodes TE among the plurality of touch electrodes TE; and a step S3230 of detecting, by the touch driver circuit TDC, a signal received from the one or more touch electrodes TE, to which the touch electrode driving signal TDS is applied, and determining, by touch controller TCTR, at least one of a touch or touch coordinates on the basis of the detected signal.

In step S3220, while the touch electrode driving signal TDS is being applied to one or more touch electrodes TE, one or more pulse signals generated on the basis of the one or more other reference pulse signals may be applied to the display panel DISP or the printed circuit board PCB.

The first reference pulse signal PWM1 and the one or more other reference pulse signals may have the same frequency.

The touch electrode driving signal TDS, generated on the basis of the first reference pulse signal PWM1, and the one or more pulse signals, generated on the basis of the one or more other reference pulse signals, may have corresponding phases.

In step S3210, the microcontroller MCU may output the first reference pulse signal PWM1 and the one or more other reference pulse signals having different phases.

The microcontroller MCU may delay the output of the first reference pulse signal PWM1, so that the first reference pulse signal PWM1 is later than the other reference pulse signals.

As set forth above, according to exemplary embodiments, the touch display device, the microcontroller, and the driving method can prevent unnecessary parasitic capacitance from being generated between one or more touch electrodes TE, among the plurality of touch electrodes TE, to which a driving signal is applied for the touch sensing, and other surrounding electrodes (e.g., the remaining touch electrodes, the data lines, and the gate lines).

According to exemplary embodiments, the touch display device, the microcontroller, and the driving method can prevent a phase difference between a touch electrode driving signal and a variety of other pulse signals in the panel driving for the touch sensing.

According to exemplary embodiments, the touch display device, the microcontroller, and the driving method can simultaneously perform the display processing and the touch sensing, and in the driving for the display processing and the touch sensing, prevent phase differences among a variety of pulses generated by a display panel, a printed circuit board, etc.

According to exemplary embodiments, the touch display device, the microcontroller, and the driving method can generate a variety of pulse signals necessary for the driving, on the basis of reference pulse signals having a variety of phase differences, and use the variety of generated pulse signals in the driving, thereby preventing phase differences among the variety of pulse signals generated by the display panel, the printed circuit board, and the like, during the driving in which the display processing and the touch sensing are simultaneously performed.

The foregoing descriptions and the accompanying drawings have been presented in order to explain certain principles of the present disclosure by way of example. A person having ordinary skill in the art to which the present disclosure relates could make various modifications and variations without departing from the principle of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A touch display device, comprising:
   a display panel having a plurality of data lines, a plurality of gate lines, and a plurality of touch electrodes;
   a gate driver circuit electrically connected to the display panel and configured to sequentially output a gate signal to the plurality of gate lines;
   a data driver circuit electrically connected to the display panel and configured to output a data signal to the plurality of data lines;
   a touch driver circuit electrically connected to the display panel and configured to output a touch electrode driving signal to one or more touch electrodes among the plurality of touch electrodes;
   a printed circuit board electrically connected to the display panel;
   a touch power circuit mounted on the printed circuit board, and electrically connected to at least one of the gate driver circuit, the data driver circuit, or the touch driver circuit; and
   a microcontroller mounted on the printed circuit board, and the microcontroller configured to output two or more reference pulse signals including a first reference pulse signal and one or more other reference pulse signals,
   wherein the touch electrode driving signal is based on the first reference pulse signal,
   wherein, while the touch electrode driving signal is being applied to the one or more touch electrodes, one or more pulse signals based on the other reference pulse signals are applied to the display panel or the printed circuit board,
   wherein the first reference pulse signal and the other reference pulse signals have the same frequency,
   wherein the touch electrode driving signal, based on the first reference pulse signal, and the one or more pulse signals, based on the other reference pulse signals, have corresponding phases,
   wherein the first reference pulse signal has a first phase and at least one of the other reference pulse signals has a second phase different from the first phase, and
   wherein a phase difference between the first phase and the second phase is configured to be determined either based on a propagation time of each of two or more reference pulse signals or based on propagation time differences between the two or more reference pulse signals.

2. The touch display device according to claim 1, wherein the microcontroller is configured to output a second reference pulse signal different from the first reference pulse signal,
   wherein the gate driver circuit receives a low-level gate voltage, is the low-level gate voltage being a pulse signal based on the second reference pulse signal,
   wherein the touch electrode driving signal, based on the first reference pulse signal, and the low-level gate voltage, based on the second reference pulse signal, have the same frequency,
   wherein the touch electrode driving signal, based on the first reference pulse signal, and the low-level gate voltage, based on the second reference pulse signal, have the same phase, and
   wherein the first reference pulse signal and the second reference pulse signal have different phases.

3. The touch display device according to claim 2, wherein the microcontroller is configured to delay output of the first reference pulse signal so the first reference pulse signal is output later than the second reference pulse signal.

4. The touch display device according to claim 1, wherein the microcontroller is configured to output a third reference pulse signal different from the first reference pulse signal,
   wherein, while the touch electrode driving signal, based on the first reference pulse signal, is being applied to the one or more touch electrodes among the plurality of touch electrodes, a pulse signal, based on the third reference pulse signal, is applied to touch electrodes other than the one or more touch electrodes, among the plurality of touch electrodes,
   wherein the first reference pulse signal and the third reference pulse signal have the same frequency,
   wherein the touch electrode driving signal, based on the first reference pulse signal, and the pulse signal, based on the third reference pulse signal, have the same phase, and
   wherein the first reference pulse signal and the third reference pulse signal have different phases.

5. The touch display device according to claim 4, wherein the microcontroller delays output of the first reference pulse signal so the first reference pulse signal is later than the third reference pulse signal.

6. The touch display device according to claim 1, wherein the microcontroller is configured to output a fourth reference pulse signal different from the first reference pulse signal,
   wherein, while the touch electrode driving signal based on the first reference pulse signal is being applied to the one or more touch electrodes, the data driver circuit configured to output an image-displaying data signal in response to a gamma reference voltage, which is a pulse signal based on the fourth reference pulse signal,
   wherein the touch electrode driving signal, based on the first reference pulse signal, and the gamma reference voltage, based on the fourth reference pulse signal, have the same frequency,
   wherein the touch electrode driving signal, based on the first reference pulse signal, and the gamma reference voltage, based on the fourth reference pulse signal, have the same phase, and
   wherein the first reference pulse signal and the fourth reference pulse signal have different phases.

7. The touch display device according to claim 6, wherein the microcontroller is configured to delay output of the first reference pulse signal so the first reference pulse signal is later than the fourth reference pulse signal.

8. The touch display device according to claim 1, wherein the microcontroller is configured to output a fifth reference pulse signal different from the first reference pulse signal,
wherein the gate driver circuit is configured to receive a high-level gate voltage, is the high-level gate voltage being a pulse signal based on the fifth reference pulse signal,
wherein the touch electrode driving signal, based on the first reference pulse signal, and the high-level gate voltage, based on the fifth reference pulse signal, have the same frequency,
wherein the touch electrode driving signal, based on the first reference pulse signal, and the high-level gate voltage, based on the fifth reference pulse signal, have the same phase, and
wherein the first reference pulse signal and the fifth reference pulse signal have different phases.

9. The touch display device according to claim 8, wherein the microcontroller is configured to delay output of the first reference pulse signal so the first reference pulse signal is later than the fifth reference pulse signal.

10. The touch display device according to claim 1, wherein the microcontroller is configured to output a sixth reference pulse signal different from the first reference pulse signal,
wherein the gate driver circuit is configured to receive a gate clock signal, the gate clock signal being a pulse signal based on the sixth reference pulse signal,
wherein the touch electrode driving signal, based on the first reference pulse signal, and the gate clock signal, based on the sixth reference pulse signal, have the same frequency,
wherein the touch electrode driving signal, based on the first reference pulse signal, and the gate clock signal, based on the sixth reference pulse signal, have the same phase, and
wherein the first reference pulse signal and the sixth reference pulse signal have different phases.

11. The touch display device according to claim 10, wherein the microcontroller is configured to delay output of the first reference pulse signal so the first reference pulse signal is later than the sixth reference pulse signal.

12. The touch display device according to claim 1, further comprising two or more feedback lines extending from output points of two or more of the data driver circuit, the gate driver circuit, the touch driver circuit, and the touch power circuit, to the microcontroller,
wherein the microcontroller is further configured to:
output the two or more reference pulse signals or two or more dedicated test signals corresponding to the two or more reference pulse signals;
receive two or more feedback pulse signals regarding the two or more reference pulse signals or the two or more dedicated test signals through the two or more feedback lines; and
determine the propagation time of each of the two or more reference pulse signals or the propagation time differences between the two or more reference pulse signals, based on the two or more feedback pulse signals, and store the propagation time or the propagation time differences in a register.

13. The touch display device according to claim 1, wherein the microcontroller comprises a clock counter configured to determine the propagation time differences between the two or more reference pulse signals based on fine clocks, or configured to create a phase difference between the two or more reference pulse signals based on the fine clocks.

14. A microcontroller mounted on a printed circuit board of a touch display device including a display panel and the printed circuit board electrically connected to the display panel, the microcontroller comprising:
a register storing information regarding two or more reference pulse signals; and
a signal generator configured to generate and output two or more reference pulse signals having the same frequency,
wherein the signal generator is configured to generate phase differences between the two or more reference pulse signals so that a plurality of pulse signals generated by external signal supply components, based on the two or more reference pulse signals, have the same phase in the display panel or the printed circuit board,
wherein the two or more reference pulse signals include a first reference pulse signal having a first phase and a second reference pulse signal having a second phase different from the first phase, and
wherein a phase difference between the first phase and the second phase is configured to be determined either based on a propagation time of each of the first and second reference pulse signals or based on propagation time differences between the first and second reference pulse signals.

15. The microcontroller according to claim 14, further comprising an automatic compensator configured to determine the propagation time of each of the two or more reference pulse signals or the propagation time differences between the two or more reference pulse signals, and configured to store the propagation time or the propagation time differences in the register.

16. The microcontroller according to claim 14, further comprising a clock counter configured to determine the propagation time differences between the two or more reference pulse signals based on fine clocks, or configured to create a phase difference between the two or more reference pulse signals based on the fine clocks.

17. A method of driving a touch display device including a display panel having a plurality of data lines, a plurality of gate lines, and a plurality of touch electrodes, a touch driver circuit driving the plurality of touch electrodes, a printed circuit board electrically connected to the display panel, and a microcontroller mounted on the printed circuit board, the method comprising:
outputting, by the microcontroller, a first reference pulse signal and one or more other reference pulse signals having the same frequency; and
applying, by the touch driver circuit, a touch electrode driving signal that is a pulse signal based on the first reference pulse signal, to one or more touch electrodes among the plurality of touch electrodes,
wherein, in the application of the touch electrode driving signal, one or more pulse signals based on the other reference pulse signals are applied to the display panel or the printed circuit board while the touch electrode driving signal is being applied to the one or more touch electrodes,
wherein the first reference pulse signal and the other reference pulse signals have the same frequency,
wherein the touch electrode driving signal, based on the first reference pulse signal, and the one or more pulse signals, based on the other reference pulse signals, have corresponding phases, wherein the first reference pulse signal has a first phase and at least one of the other reference pulse signals has a second phase different from the first phase, and wherein a phase difference between the first phase and the second phase is configured to be determined either based on a propagation time of each of two or more reference pulse signals or based on propagation time differences between the two or more reference pulse signals, and the two or more reference pulse signals include the first reference pulse signal and the at least one of the other reference pulse signals.

18. The method according to claim 17, wherein the microcontroller delays outputting of the first reference pulse signal so the first reference pulse signal is output later than the other reference pulse signals.

* * * * *